(12) United States Patent
Krull et al.

(10) Patent No.: US 8,530,343 B2
(45) Date of Patent: *Sep. 10, 2013

(54) SYSTEM AND METHOD FOR THE MANUFACTURE OF SEMICONDUCTOR DEVICES BY THE IMPLANTATION OF CARBON CLUSTERS

(75) Inventors: Wade A. Krull, Marblehead, MA (US); Thomas N. Horsky, Boxborough, MA (US)

(73) Assignee: SemEquip, Inc., North Billerica, MA (US)

( * ) Notice: Subject to any disclaimer, the term of this patent is extended or adjusted under 35 U.S.C. 154(b) by 82 days.

This patent is subject to a terminal disclaimer.

(21) Appl. No.: 13/169,341

(22) Filed: Jun. 27, 2011

(65) Prior Publication Data

US 2011/0306193 A1 Dec. 15, 2011

Related U.S. Application Data

(63) Continuation of application No. 12/508,800, filed on Jul. 24, 2009, now Pat. No. 8,097,529, which is a continuation of application No. 11/634,565, filed on Dec. 6, 2006, now Pat. No. 7,666,771.

(60) Provisional application No. 60/748,797, filed on Dec. 9, 2005.

(51) Int. Cl.
*H01L 21/425* (2006.01)

(52) U.S. Cl.
USPC ............. 438/515; 438/528; 257/E21.339

(58) Field of Classification Search
USPC .................................. 438/515, 528
See application file for complete search history.

(56) References Cited

U.S. PATENT DOCUMENTS 5,354,381 A 10/1994 Sheng
5,497,006 A 3/1996 Sferlazzo et al.
(Continued)

FOREIGN PATENT DOCUMENTS

DE 4440072 2/1996
EP 0 219 243 4/1987
(Continued)

OTHER PUBLICATIONS

Cowern et al., Computational Modeling of Co-implanted Carbon for 65mn Node USJ Formation, p. 300, 2004.
(Continued)

*Primary Examiner* — Stephen W Smoot
(74) *Attorney, Agent, or Firm* — John S. Paniaguas; Katten Muchin Rosenman LLP

(57) ABSTRACT

A process is disclosed which incorporates implantation of a carbon cluster into a substrate to improve the characteristics of transistor junctions when the substrates are doped with Boron and Phosphorous in the manufacturing of PMOS transistor structures in integrated circuits. There are two processes which result from this novel approach: (1) diffusion control for USJ formation; and (2) high dose carbon implantation for stress engineering. Diffusion control for USJ formation is demonstrated in conjunction with a boron or shallow boron cluster implant of the source/drain structures in PMOS. More particularly, first, a cluster carbon ion, such as $C_{16}H_x^+$, is implanted into the source/drain region at approximately the same dose as the subsequent boron implant; followed by a shallow boron, boron cluster, phosphorous or phosphorous cluster ion implant to form the source/drain extensions, preferably using a borohydride cluster, such as $B_{18}H_x^+$ or $B_{10}H_x^+$. Upon subsequent annealing and activation, the boron diffusion is reduced, due to the gettering of interstitial defects by the carbon atoms.

13 Claims, 17 Drawing Sheets

(56) References Cited

U.S. PATENT DOCUMENTS

| | | | |
|---|---|---|---|
| 5,558,718 | A | 9/1996 | Leung |
| 6,043,139 | A | 3/2000 | Eaglesham et al. |
| 6,153,920 | A | 11/2000 | Gossmann et al. |
| 6,207,005 | B1 | 3/2001 | Henley et al. |
| 6,452,338 | B1 | 9/2002 | Horsky |
| 6,686,595 | B2 | 2/2004 | Horsky |
| 6,893,907 | B2 | 5/2005 | Maydan et al. |
| 7,015,108 | B2 | 3/2006 | Vanderpool et al. |
| 7,666,771 | B2 | 2/2010 | Krull et al. |
| 7,919,402 | B2* | 4/2011 | Jacobson et al. ............. 438/515 |
| 7,960,709 | B2 | 6/2011 | Horsky et al. |
| 8,071,958 | B2 | 12/2011 | Horsky et al. |
| 8,097,529 | B2 | 1/2012 | Krull et al. |
| 2002/0139975 | A1 | 10/2002 | Lewis et al. |
| 2003/0023118 | A1 | 1/2003 | Kanayama et al. |
| 2004/0002202 | A1 | 1/2004 | Horsky et al. |
| 2004/0164341 | A1 | 8/2004 | Forbes et al. |
| 2004/0166612 | A1 | 8/2004 | Maydan et al. |
| 2004/0235280 | A1 | 11/2004 | Keys et al. |
| 2005/0181621 | A1 | 8/2005 | Borland et al. |
| 2005/0191816 | A1* | 9/2005 | Vanderpool et al. .......... 438/305 |
| 2006/0097193 | A1 | 5/2006 | Horsky et al. |
| 2007/0148888 | A1 | 6/2007 | Krull |
| 2007/0178678 | A1 | 8/2007 | Hatem et al. |
| 2007/0194252 | A1 | 8/2007 | Horsky et al. |
| 2008/0122005 | A1 | 5/2008 | Horsky et al. |
| 2008/0299749 | A1 | 12/2008 | Jacobson et al. |
| 2009/0286367 | A1 | 11/2009 | Krull et al. |

FOREIGN PATENT DOCUMENTS

| | | |
|---|---|---|
| EP | 06844937 | 10/2009 |
| JP | 9041138 | 2/1997 |
| JP | 11260752 | 9/1999 |
| JP | 2004217975 | 8/2004 |
| WO | WO 99/65070 | 12/1999 |
| WO | WO 01/43175 | 6/2001 |
| WO | WO 2004/003973 | 1/2004 |
| WO | WO 2004/003990 | 1/2004 |
| WO | WO 2005/079318 | 2/2005 |
| WO | WO 2007/070321 | 6/2007 |
| WO | WO 2007/146942 | 12/2007 |

OTHER PUBLICATIONS

Rizk et al., "Modeling the Suppression of Borun Diffusion in Si/SiGe Due to Carbon Incorporation", pp. 315-322, May 2006.

Robertson et al., "The effect of impurities on diffusion and activation of ion implanted boron in silicon", Mat. Res. Soc. Symp., vol. 610, 2000, pp. B5.8.1-B5.8.6.

Law et al., "Influence of Carbon on the Diffusion of Interstitials and Borun in Silicon", pp. B7.4.1-B7.4.5, Mat. Res. Soc. Symp., vol. 610, 2000.

Collart et al., "Co-Implantation with Conventional Spike Anneal Solutions for 45nm Ultra-Shallow Junction Formation", *Proc. Of 8th Intl. Workshop on Fabrication, Characterization and Modelling of Ultra-Shallow Doping Profiles in Semiconductors*, Jun. 2005, pp. 327-328.

Stolk et al., "Understanding and Controlling Transient Enhanced Dopant Diffusion in Silicon", Mat. Res. Soc. Symp. Proc., vol. 354, pp. 307-318.

Ueda et al., "High dose nitrogen and carbon shallow implantation in Si by plasma immersion ion implantation", *Nuclear Instruments and Methods in Physics Research*, 2001, pp. 715-720.

Lindner, "ion beam synthesis of buried SiC layers in silicon: Basic physical processes", *Nuclear instruments and Methods in Physics Research*, 2001, pp. 44-54.

Lindner et al., "Mechanisms of SiC Formation in the Ion Beam Synthesis of 3C-SiC Layers in Silicon", *Materials Science Forum*, vols. 264-268 (1998), pp. 215-218.

Ang et al., "Thin body siliconon-insulator N-MOSFET with silicon carbon source/drain regions for performance enhancement", *IEDM Workshop*, Washington, D.C., Dec. 2005, pp. 20.3.1-20.3.4.

Deguchi et al., "B-SiC formation by low-energy ion doping technique", *Japanese Jour. Of Appl. Physics*, vol. 29, No. 8, Aug. 1990, pp. 1493-1496.

Vanderpool et al., "Control of Phosphorus Transient Diffusing using Co-implantation" *Ion Implantation Technology*, Jun. 2006, pp. 41-45.

Liebert et al., "Plasma Doping System for 200 and 300 mm Wafers" *Proceedings, 13th Int. Conf. Ion Implant. Tech.*, IEEE, 2000, pp. 472-475.

Renau et al., "Comparison of Plasma Doping and Beamline Technologies for Low Energy Ion Implantation," *IEEE Proceedings of the 2002 14th Int. conf. on Ion Implantation Technology*, Taos, NM, USA, Sep. 22-27, 2002, pp. 151-156.

Stegemann et al., Subsequent Layer Growth of Supported Nanoparticles by Deposition of $Sb_4$ Clusters onto $MoS_2$ (0001), New Journal of Physics 4 (2002) 89.

Polak et al., "Photoelectron Spectroscopy of Small Antimony Cluster Anions" J. Chem. Phys 97 (12), Dec. 15, 1992.

Horsky et al., "Boron Beam Performance and In-Situ Cleaning of the ClusterIon Source," CP866, Ion Implantation Technology, 2006 American Institute of Physics.

Honig et al., "Vapor Pressure Data for the Solid and Liquid Elements," RCA Laboratories, RCA Review, Jun. 1969, p. 284-305.

Borland et al., "45mm Node p+ USJ Formation with High Dopant Activation and Low Damage," IEEE 2006, p. 4-9.

Borland et al., "High Dopant Activation and Low Damage P+ USJ Formation" CP866 Ion Implantation Technology, 2006 American Institute of Physics, p. 96-100.

Kawasaki et al., "Ultra-Shallow Junction Formation by $B_{18}H_{22}$ Ion Implantation" Nuclear Instruments and Methods in Physics Research B 237 (2005) p. 25-29.

Thompson et al., "Silicon Melt, Regrowth and Amorphization Velocities During Pulsed Irradiation" 1983 The American Physical Society, Physical Review Letters, vol. 50, No. 12, Mar. 21, 1983, p. 896-899.

Motooka et al., "Amorphization Processes in Ion Implanted Si: Temperature Dependence" Japanese Journal of Applied Physics, vol. 30, No. 12B, Dec. 1991, p. 3617-3620.

Horsky, "Universal Ion Source for Cluster and Monomer Implantation" Ion Implantation Technology, 2006 American Institute of Physics, p. 159.

Kirkby et al., "Ion Implantation Technology" 16th International Conference on Ion Implantation Technology IIT 2006, Marseille, France, Jun. 11-16, 2006.

Motooka et al., "Amorphization Processes in Ion Implanted Si: Ion Species Effect" 1992 American Institute of Physics, Appl. Physics Lett. 61 (25), Dec. 12, 1992.

Motooka et al., "Amorphization Processes in Self-Ion-Implanted Si: Dose Dependence" 1991 American Institute of Physics, Appl. Phys. Lett. 58 (21), May 27, 1991, p. 2360-2362.

Tieger et al., "ClusterBoron Implants Ion a High Current Implanter" 2006 American Institute of Physics, Ion Implantation Technology, p. 206-209.

Landi et al., "Electrical Activation of Boron-Implanted Silicon During Rapid Thermal Annealing" Appl. Phys. A. 47, 359-366 (1988).

Jones et al., Using Doping Superlattices to Study Transient-Enhanced Diffusion of Boron in Regrown Silicon. 1996 American Institute of Physics, Appl. Phys. Lett. 68 (22) May 27, 1996.

Solmi et al., "High-Concentration Boron Diffusion in Silicon Simulation of the Precipitation Phenomena" 1990 American Institute of Physics, J. Appl. Phys. 68 (7), Oct. 1, 1990.

Holland et al., "Characteristics of Rapid Thermal Annealing in Ion-Implanted Silicon" 1986 American Institute of Physics, J. Appl. Phys. 59 (3), Feb. 1, 1986.

Schmitz et al., "Ultra-Shallow Junction Formation by Outdiffusion from Implanted Oxide" IEEE 1998, p. 37.3.1-37.3.4.

Nishikawa et al., "Reduction of Transient Boron diffusion in Preamorphized Si by Carbon Implantation" Applied Physics Letters, Vo.1 60, Issue 18, pp. 2270-2272, May 4, 1992.

McLafferty, F.W., Interpretation of Mass Spectra, 3rd Ed. Mill Valley, CA: University Science Books, 1980, ISBN 09357020 40. pp. 38, 76 and 186-187.

Sekar et al., "Optimization of Annealing for Cluster Boron and Cluster Carbon PMOS SDE," 14th international Conference on Advanced Thermal Processing of Semiconductors—RTP2006.

Volz et al., "Silicon carbide and Amorphous Carbon Film formation by Plasma Immersion Ion Implantation: a Comparison of Methane and Toluene as Plasma Forming Gases" Surface and Coatings Technology 136 (2001).

* cited by examiner

EXAMPLE OF CMOS FABRICATION SEQUENCE
NMOS DRAIN EXTENSION

SYSTEM AND METHOD FOR THE MANUFACTURE OF SEMICONDUCTOR DEVICES BY THE IMPLANTATION OF CARBON CLUSTERS

CROSS REFERENCE TO RELATED APPLICATIONS

This application is a continuation of U.S. patent application Ser. No. 12/508,800, filed on Jul. 24, 2009, now U.S. Pat. No. 8,097,529, which is a continuation of U.S. patent application Ser. No. 11/634,565, filed on Dec. 6, 2006, now U.S. Pat. No. 7,666,771, which, in turn, claims priority to and the benefit of U.S. Provisional Patent Application No. 60/748, 797, filed on Dec. 9, 2005, hereby incorporated by reference.

BACKGROUND OF THE INVENTION

1. Field of the Invention

The present invention relates to a method of semiconductor manufacturing and more particularly to a method for implantation of carbon-containing clusters into a substrate for stress engineering and diffusion control to improve the characteristics of transistor junctions when doping substrates with boron, arsenic and phosphorous in the manufacturing of PMOS transistor structures in integrated circuits.

2. Description of the Prior Art

The Ion Implantation Process

The fabrication of semiconductor devices involves, in part, the formation of transistor structures within a silicon substrate by ion implantation. As disclosed by Sferlazzo et. al. in U.S. Pat. No. 5,497,006, ion implantation equipment includes an ion source which creates a stream of ions containing a desired dopant species, a beam line which extracts and accelerates the ions from the ion source by means of an extraction electrode, and forms and focuses the ion stream into an ion beam having a well-defined energy or velocity, an ion filtration system which selects the ion of interest, since there may be different species of ions present within the ion beam, and a process chamber which houses the silicon substrate upon which the ion beam impinges; the ion beam penetrating a well-defined distance into the substrate. Transistor structures are created by passing the ion beam through a mask formed directly on the substrate surface, the mask being configured so that only discrete portions of the substrate are exposed to the ion beam. Where dopant ions penetrate into the silicon substrate, the substrate's electrical characteristics are locally modified, creating source, drain and gate structures by the introduction of electrical carriers: such as, holes by p-type dopants, such as boron or indium, and electrons by n-type dopants, such as phosphorus or arsenic, for example.

A recent development in semiconductor processing is the incorporation of mechanical stress to enhance transistor performance. This stress is generated by including atoms of elements other than silicon into a lattice structure. The successful process to date has been the incorporation of Ge atoms into the source and drain regions of a PMOS transistor. Inclusion of Ge atoms into a silicon substrate forms a SiGe alloy, which has a compatible lattice structure with the Si lattice. However, the Ge atoms are larger than the Si atoms, resulting in a larger lattice constant for the SiGe alloy, which can be controlled by the amount of Ge included. By forming this alloy material in the source and drain region of a PMOS transistor, the larger lattice therein places the channel region under compressive stress, which enhances the hole mobility and increases the performance of the PMOS transistor. The inclusion of Ge atoms only works for PMOS transistors because compressive stress is detrimental to the electron mobility and degrades the performance of an NMOS transistor.

Prior Art Ion Sources

Traditionally, Bernas-type ion sources have been used in ion implantation equipment. Such ion sources are known to break down dopant-bearing feed gases, such as $BF_3$, $AsH_3$ or $PH_3$, for example, into their atomic or monomer constituents, producing the following ions in copious amounts: $B^+$, $As^+$ and $P^+$. Bernas-type ion sources are known as hot plasma or arc discharge sources and typically incorporate an electron emitter, either a naked filament cathode or an indirectly-heated cathode. This type of source generates a plasma that is confined by a magnetic field. Recently, cluster implantation ion sources have been introduced into the equipment market. These ion sources are unlike the Bernas-style sources in that they have been designed to produce "clusters", or conglomerates of dopant atoms in molecular form, e.g., ions of the form $As_n^+$, $P_n^+$, or $B_nH_m^+$, where n and m are integers, and $2 \leq n \leq 18$. Such ionized clusters can be implanted much closer to the surface of the silicon substrate and at higher doses relative to their monomer (n=1) counterparts, and are therefore of great interest for forming ultra-shallow p-n transistor junctions, for example in transistor devices of the 65 nm, 45 nm, or 32 nm generations. These cluster sources preserve the parent molecules of the feed gases and vapors introduced into the ion source. The most successful of these have used electron-impact ionization, and do not produce dense plasmas, but rather generate low ion densities at least 100 times smaller than produced by conventional Bernas sources. For example, the method of cluster implantation and cluster ion sources has been described by Horsky et al. in U.S. Pat. No. 6,452,338 and U.S. Pat. No. 6,686,595 hereby incorporated by reference. The use of $B_{18}H_{22}$ as an implant material for ion implantation of $B_{18}H_x^+$ in making PMOS devices is disclosed in Horsky et al. in pending U.S. patent application Ser. No. 10/251,491, published as US Patent Application Publication No. US 2004/0002202 A1, hereby incorporated by reference.

Background: USJ Challenges

As device technology continues to scale in all dimensions, it becomes increasingly difficult to form the p-type Ultra Shallow Junctions, or USJ, necessary for the proper formation of the PMOS transistor. The most challenging feature of the PMOS transistor is the Source/Drain Extension, or SDE, which must be the shallowest junction in the transistor to be effective. For 65 nm node technology (as defined in the International Technology Roadmap for Semiconductors, or ITRS), it is required that the PMOS SDE be around 15-25 nm deep, while 45 nm technology will require PMOS SDE junction depths of 8-20 nm. There are two principal means of controlling the junction depth: (1) controlling the initial placement of the boron dopants, and (2) controlling their subsequent movement during activation. The dopants move whenever they experience high temperature, such as during the implant anneal and activation process. The initial placement of the dopant is determined by the implant energy of the dopant ion. Both of these means have historically been used to scale the vertical dimension of the PMOS SDE as the technology scales to smaller gate lengths. The principal means of reducing PMOS SDE junction depth in recent generations has been by reducing the annealing time during the activation step, which reduces dopant diffusion and thereby results in the formation of a shallower junction. The implant energy has also been reduced to make the initial dopant placement shallower, i.e., closer to the silicon surface, but since implanter beam currents are reduced at lower beam energy, and substantially so at the sub-keV boron energies required for boron implantation for sub-90 nm feature sizes, this significantly reduces the productivity (wafer throughput) of the implant tool, and so is not an attractive means to reduce junction depth.

Diffusion Control

Diffusion is a natural result of the need to activate the implanted boron, that is, the implanted wafer must be annealed at high temperature for the implanted boron to become electrically active in the silicon. Whenever silicon containing boron is exposed to high temperatures, the boron will move, or diffuse, from regions of high concentration to regions of lower concentration. This boron movement challenges the formation of very shallow junctions. The major trend in anneal development has been the reduction of annealing time, which manages the net diffusion. Modern wafer processing incorporates a "spike" anneal which quickly ramps to a high temperature (1000-1100 C) and down again. This technique has been very effective in reducing diffusion and providing a production worthy process solution. However, for sub-90 nm node technology even less boron diffusion is required; the ramp rate limit of spike annealing systems (up to 150 C/sec) has been reached. The next step in reducing thermal budget this trend will likely use the "millisecond" technologies of either "flash annealing" or laser thermal processing. Both of these technologies are still immature and face significant challenges in providing production worthy solutions. Also, as thermal budgets are reduced to very small values by these ultra-fast annealing approaches, the activation process itself is affected. For example, higher sheet resistances are achieved and the spatial non-uniformity of the sheet resistance, or Rs, is higher than achieved by spike anneals.

Co-Implantation

One alternative to the continued reduction of annealing time is the introduction of other impurities which are known to hinder the diffusion of boron, potentially resulting in a shallower junction at the same thermal budget. For example, it is well known that F, historically introduced during a $BF_2^+$ implantation step, can reduce boron diffusion. Thus, junctions formed by a $BF_2^+$ implant are usually shallower than the equivalent $B^+$ implant when the same annealing process is used. However, since the F is introduced in the same implantation process as the boron, i.e., as part of the molecular species $BF_3$, the as-implanted F depth profile that results from $BF_2^+$ implant is not optimized for the reduction of B diffusion; this makes $BF_2$ implantation less attractive as junction depths are reduced further.

Another alternative is the introduction of carbon, which is also known to inhibit diffusion. See for example, E. J. Collart, S. B. Felch, H. Graoui, D. Kirkwood, B. J. Pawlak, P. P. Absil, S. Sevri, T. Janssens and W. Vandervorst, "Co-Implantation with Conventional Spike Anneal Solutions for 45 nm Ultra-Shallow Junction Formation", Proceedings of the Eight International Workshop on: Fabrication, Characterization and Modelling of Ultra-Shallow Doping Profiles in Semiconductors, June 2005, p. 327; N. Cowern, B. Colombeau, J. Graoui, and M. Foad, "Computational Modeling of Co-implanted Carbon for 65 nm Node USJ Formation, ibid, p. 300; S. Rizk, Y. M. Haddara and A. Sibaja-Hernandez, "Modeling the Suppression of Boron Diffusion in Si/SiGe Due to Carbon Incorporation, ibid, p. 315; L. S. Robertson, R. Brindos, and K. S. Jones, "The effect of impurities and activation of ion implanted boron in silicon", Mat. Res. Soc. Symp. Vol. 610, pp. B5.8.1-B5.8.6 (2000); Mark E. Law, Michelle D. Griglione, and Misty Northridge, "Influence of Carbon on the Diffusion of Interstitials and Boron in Silicon", ibid, pp. B7.4.1-B7.4.5; E. J. H. Gonad et al., "Co-implantation with conventional spike anneal solutions for 45 nm ultra-shallow junction formation", Internal Conference on Ultra-Shallow Junctions, USJ2005, June 5-8, Florida, USA (2005); P. A. Stolk, H.-J. Gossmann, D. J. Eaglesham, D. J. Jacobson, H. S. Luftman, and J. M. Poate, "Understanding and controlling transient enhanced dopant diffusion in silicon", Mat. Res. Soc. Symp. Proc. Vol. 354, pp. 307-318 (1995); M. Ueda, H. Reuther, R. Gunzel, A. F. Beloto, E. Abramof, and L. A. Berni, "High dose nitrogen and carbon shallow implantation in Si by plasma immersion ion implantation", Nuclear Instruments and Methods in Physics Research B 175-177 (2001) pp. 715-720; Jörg K. N. Lindner, "Ion beam synthesis of buried SiC layers in silicon: Basic physical processes", Nuclear Instruments and Methods in Physics Research B 178 (2001) pp. 44-54; J. K. N. Lindner, W. Reiber and B. Stritzker, "Mechanisms of SiC Formation in the Ion Beam Synthesis of 3C-SiC Layers in Silicon", Materials Science Forum Vols. 264-268 (1998) pp. 215-218; M. Ueda et al., "High dose nitrogen and carbon shallow implantation in Si by plasma immersion ion implantation", Nuclear Instruments and Methods in Physics Research B 175-177 (2001) pp. 715-720; Kah-Wee Ang et al., "Thin body silicon-on-insulator N-MOSFET with silicon-carbon source/drain regions for performance enhancement", IEDM Workshop, Washington, D.C., December, 2005; Masahiro Deguchi, Akihisa Yoshida, and Masatoshi Kitagawa, "B-SiC formation by low-energy ion-doping technique", Japanese Journal of Applied Physics Vol. 29, No. 8, August, 1990, pp. L 1493-L 1496, all hereby incorporated by reference.

Stress Engineering and Carrier Mobility Enhancement

One of the newer trends in silicon processing is called stress engineering, whereby structures are created which purposefully put active structures under mechanical stress due to lattice mismatch. The primary goal of such effort is to put the channel region of a MOS transistor under stress to enhance the carrier mobility. PMOS transistors benefit from compressive stress, and NMOS transistors benefit from tensile stress. The leading process for creating compressive stress is the incorporation of Ge into the silicon lattice, and forming a SiGe alloy. Ge is useful in this role because it is a larger atom than the silicon and the incorporation of Ge forces the lattice to expand, thereby placing adjacent regions under stress. The most public use of this concept is the Intel 90 nm technology whereby the PMOS source/drain regions are epitaxially grown SiGe alloy structures which place the channel region in compressive stress, thereby enhancing the performance of the PMOS transistor and the overall circuit.

Stress Engineering for Sub-65 nm Logic and Memory Applications

The 65 nm technology node requires further reduction of the SDE junction depth to produce appropriate transistor structures. Starting with this node, the PMOS SDE becomes very challenging from both a process control and productivity perspective. The energy of the boron implant must be reduced to 500 eV boron energy or less, where productivity is markedly reduced. Also, the annealing requirements are such that advanced, low-thermal budget spike anneals are required and even new, alternative annealing technologies must be considered. Due to the difficulty of achieving these process goals, alternative processes must be considered. The introduction of stress engineering to produce a higher performance transistor can alleviate the immediate need to reduce the gate length in order to enhance speed and drive current. The concept is that producing a transistor where the active channel is permanently under stress allows the formation of higher performance transistors. The mechanism for this advancement is that the stress modifies the carrier mobility and thereby directly improves the transistor drive current and therefore the speed of the circuit. The stress engineering required is not simple, since the NMOS transistor performance improves with tensile stress while the PMOS transistor performance improves with compressive stress. For example, Intel has integrated stress engineering at the 90 nm node by the introduction of SiGe source/drain technology which places the PMOS channel under compressive stress and thereby improves the performance of the PMOS and the use of a selective silicon nitride overlayer which places the NMOS transistor in tensile stress, enhancing NMOS performance. The combination of these stress engineering technologies results in significant performance enhancement for the circuit overall. To be competitive with these processes, some analysts believe that stress engineering will be required for all high performance products starting at the 65 nm node.

So-Called Diffusionless Anneals

To maximize the benefit of reducing annealing time, the current trend is to continuously reduce the time of the annealing process (the thermal budget) and so reduce the boron diffusion. The peak temperature remains high (typically higher than 1000 C) in order to achieve high activation for the dopant atoms. Current production processes use a "spike anneal" which involves a ramp to temperature, zero time at max temperature, and then a ramp down in temperature back to room temp. Typical values of the ramp rates are from 100 C/s to 1000 C/s, with ramp rate to temperature driven by choice of heating technology. Cool down ramp rate is generally limited to less than 400 C/s unless active cooling is employed. New systems are constantly being developed which increase ramp rate and thereby reduce total time at high temperature.

The limit of this approach, now under development, is generically labeled "diffusionless anneal". There are two technologies under development which might provide such a process option: "flash" anneal and "laser thermal anneal". Both of these technologies have the potential to provide an anneal process with adequate activation (peak temperatures typically 1300 C) and very little boron diffusion. These technologies are also called "millisecond anneals" because the silicon experiences the high temperature required for activation for only a millisecond or less. While this process alternative is very attractive, the technologies required for such a process are radically different than the annealing technologies currently in production. These tools are new and do not yet meet the requirements for large scale production. It is uncertain whether diffusionless anneals will provide robust manufacturing solutions in the near future.

Carbon Implantation (Gettering Implants)

Carbon implantation has been used as a method of gettering defects or contaminants for some time. See, for example, the Stolk et al and the Ueda et al references above. Since defects have been shown to drive transient enhanced diffusion of B and P in silicon, trapping interstitial defects has been seen as a candidate method for limiting diffusion. Conventional processes use either $CO_2$ or CO gas source to a conventional plasma ion source. Beams of $C^+$ are generated and implantation can be performed with a commercial ion implantation system. The use of $CO_2$ or CO gas degrades the service lifetime of conventional plasma sources due to oxidation effects and also carbon tracking of insulators found in the sources.

One prior application of carbon implants is to provide gettering of metallic impurities by implanting high energy (MeV) carbon deep into the silicon, away from the transistor structure. In silicon, any metal atoms present can degrade the electrical performance of active structures, principally by increasing leakage. There has been much research of methods of removing metallic impurities from the active device regions. One approach which has been used is the implantation of carbon into the silicon away from the active devices. Since carbon in silicon acts as an impurity trap, any metallic atoms that interact with the carbon will stay in that location; even when high temperatures are experienced. This mechanism is called gettering and carbon implants are one of the options for gettering.

SUMMARY OF THE INVENTION

Briefly, the present invention relates to a process which incorporates implantation of a carbon cluster into a substrate to improve the characteristics of transistor junctions when the substrates are doped with boron, arsenic and phosphorous in the manufacturing of PMOS transistor structures in integrated circuits. There are two processes which result from this novel approach: (1) diffusion control for USJ formation; and (2) high dose carbon implantation for stress engineering. Diffusion control for USJ formation is demonstrated in conjunction with a boron or shallow boron cluster implant of the source/drain structures in PMOS. More particularly, a duster carbon ion, such as $C_{16}H_x^+$, is implanted into the source/drain region at approximately the same dose as the subsequent boron implant; followed by a shallow boron implant to form the source/drain extensions, preferably using a borohydride cluster, such as $B_{18}H_x^+$ or $B_{10}H_x^+$. Upon subsequent annealing and activation, the boron diffusion is reduced, due to the gettering of interstitial defects by the carbon atoms. The Stolk et al., and Robertson et al references, mentioned above, assert that transient enhanced diffusion of boron is mediated by interstitial defects in the silicon lattice.

There is a secondary benefit to the process in accordance with the present invention that is of great economic value; namely, amorphization of the silicon by the carbon cluster implant and the subsequent boron cluster implant. In particular, it is known in the art that implantation of large boron clusters amorphize the crystalline silicon lattice, resulting in a large reduction in ion channeling. Channeling is known to significantly increase the junction depth of a dopant implant thereby making USJ formation difficult. Channeling is typically controlled by first conducting a damage implant, for example by $Ge^+$ atoms, to amorphise the silicon prior to forming the PMOS source/drain extensions by implanting boron. The Ge+ implant is expensive to perform, and has also been shown to create defects at its end-of-range which increases leakage currents in the USJ transistors, in certain cases by several orders of magnitude. Thus, replacing the conventional boron implant by a boron cluster, such as $B_{18}H_x^+$, obviates the need for the Ge implant in many cases, and does not generate the defect structures associated with leakage. This is of great economic value since is removes a costly implant from the process flow, increases yield, and reduces leakage current in the integrated circuits. Unfortunately, the boron cluster implant can never entirely eliminate channeling, since before the critical dose for amorphization is reached, a fraction of the boron cluster implant has been performed, and has contributed to a channeling tail. For example, an 80% reduction in channeling has been demonstrated by the implantation of $B_{18}H_x^+$ ions to form the source/drain extensions, but to achieve the most shallow junctions, a damage implant is still required. If, however, according to the process in accordance with the present invention, a carbon cluster is implanted followed by an implant of either boron clusters or monomer boron, the silicon has been fully amorphized by the carbon implant, so channeling can be entirely eliminated.

Finally, if thermally-driven boron diffusion can be minimized by the appropriate carbon co-implant, the need for diffusionless anneals can be averted. For example, FIGS. 3-7 suggest that a standard, commercially viable spike anneal should be adequate to form USJ structures. This would be of great economic benefit to the chip making industry, not requiring next-generation exotic annealing technologies.

Thus, the benefit of this method is:
Amorphization of the silicon prior to the PMOS USJ formation;
Elimination of the channeling tail in the subsequent boron or boron cluster implant, resulting in shallowest as-implanted profiles;
Dramatically reduced boron diffusion during the annealing step;
Elimination of the pre-amorphization, or damage, implant;
Relaxing the thermal budget requirements in the annealing process, enabling USJ formation with spike anneals.

In addition, when very shallow carbon implants are required, the use of a carbon cluster by the process in accordance with the present invention increases the effective dose rate (and hence the wafer throughput) relative to performing monomer carbon implants, providing a similar increase to throughput achieved by substituting boron clusters for monomer boron.

Phosphorus Diffusion Control

The preceeding discussion focused on the use of carbon to inhibit diffusion of boron implants for the formation of the PMOS transistor. Likewise, the same discussion applies to the formation of the NMOS transistor if phosphorus is used as the dopant atom. Conventionally, an arsenic implant is used to form the NMOS SDE structure, and Arsenic exhibits slow diffusion in silicon, so no additional means are necessary to form the appropriate structure. However, there are issues which might preclude the use of Arsenic for the SDE in advanced technologies. In these cases, phosphorus may become a viable alternative, but phosphorus exhibits fast diffusion in silicon and so diffusion inhibition by carbon becomes an attractive process. An example of results showing carbon to be useful for diffusion control with phosphorus implants is A. Vanderpool, A. Budrevich and M. Taylor, "Control of Phosphorus Transient Enhanced Diffusion using Co-Implantation, Proceedings of the 16$^{th}$, International Conference on Ion Implantation Technology, June 2006, p. 41.

The use of ionized clusters of carbon and/or boron requires a novel ion source, for example, as disclosed in U.S. Pat. No. 6,686,595, hereby incorporated by reference A vapor of, preferably, a hydrocarbon is introduced into the ion source. The ion source ionizes the molecule without dissociation. The extraction system then extracts an ion beam of the ionized carbon molecule which is then transported down the beam line of a conventional ion implanter to impact the silicon wafer. A ClusterIon® ion source developed by SemEquip, as disclosed in the '595 patent, for example, may be used for the implantation of ClusterBoron® molecules, such as $B_{18}H_{22}$.

The same technology has now been demonstrated to work with large hydrocarbon feed materials. For example, the following hydrocarbons may potentially be used:
2,6 diisopropylnaphthalene ($C_{16}H_{20}$)
N-octadene ($C_{18}H_{38}$)
P-Terphenyl ($C_{18}H_{14}$)
Bibenzyl ($C_{14}H_{14}$)
1-phenylnaphthalene ($C_{16}H_{12}$)
Flouranthene ($C_{16}H_{10}$)

Flouranthene is the material used to generate much of the data included in this disclosure. In general, any hydrocarbon with a chemical formula of the form CnHy, where n≧4 and y≧0 will provide the above features and benefits, namely, increasing the effective carbon dose rate into the silicon, and providing varying degrees of amorphization, in all cases being more beneficial than a monomer carbon implant.

The $C_{16}H_{10}$ vaporizes at a temperature of 100 C, well suited to the novel ion source, and similar to the vaporization temperature of $B_{18}H_{22}$, as disclosed in pending U.S. patent application Ser. No. 10/251,491, mentioned above. A beam current of 0.5 mA enabled the equivalent of 8 mA of carbon on the wafer, at very low energy (about 1 keV per carbon atom). Using a ClusterIon® source, beam currents of >1 mA are easily realized.

Monomer Vs Cluster Carbon Implantation

Carbon implantation has been available essentially since the introduction of commercial ion implantation systems for semiconductor manufacturing, which started in the mid-1970s. The available implantation technology performs the implant one atom at a time, regardless of the feed material used. This occurs because conventional ion source technology uses an intense plasma to ionize the material, and the plasma breaks apart molecules into their component atoms. For most applications, this works well. The issue with the conventional technology is that the implantation by single atoms becomes very inefficient when the energy of the ions must be low (e.g., 1 or 2 keV) in order to provide for shallow implant. Conventional systems cannot produce high currents at low extraction energy and so the implantation process has very low productivity. This is exactly the problem with low energy boron implantation, and the physics are the same for low energy carbon implants. The invention described here enables the implantation of carbon clusters at low energies with very high productivity. By implanting carbon-containing molecules instead of individual atoms, the physics of low energy implantation are significantly modified. The extraction energy is much higher, since the molecule needs the process energy for each carbon atom, which makes the extraction system able to operate efficiently and generate high beam currents.

Plasma Doping with Clusters

An alternative approach to beam line ion implantation for the doping of semiconductors is so-called "plasma immersion". This technique is known by several other names in the semiconductor industry, such as PLAD (PLAsma Doping), PPLAD (Pulsed PLAsma Doping, and PI$^3$ (Plasma Immersion Ion Implantation). Plasma doping is well known in art. See for example: A. Renau and J. T. Scheuer, "Comparison of Plasma Doping and Beamline Technologies for Low energy Ion Implantation", IEEE Proceedings of the 2002 14th International Conference on Ion Implantation Technology, Taos, N. Mex., USA, 22-27 Sep. 2002, pp. 151-156; R. B. Liebert, S. R. Walther, S. B. Felch, Z. Fang, B. Pedersen, D. Hacker, "Plasma Doping System for 200 mm and 300 mm Wafers, "Proceedings, 13th Int. Conf. Ion Implant. Tech., IEEE, 2000, pp. 472-475, as well as U.S. Pat. Nos. 5,354,381; 5,558,718; and 6,207,005, all hereby incorporated by reference Doping using these techniques requires striking a plasma in a large vacuum vessel that has been evacuated and then backfilled with a gas containing the dopant of choice such as boron triflouride, diborane, arsine, or phosphine. The plasma by definition has positive ions, negative ions and electrons in it. The target is then biased negatively thus causing the positive ions in the plasma to be accelerated toward the target. The energy of the ions is described by the equation U=QV, where U is the kinetic energy of the ions, Q is the charge on the ion, and V is the bias on the wafer. With this technique there is no mass analysis. All positive ions in the plasma are accelerated and implanted into the wafer. Therefore extremely clean plasma must be generated. With this technique of doping a vapor of boron clusters, such as $B_{18}H_{22}$, or arsenic or phosphorus clusters of the form $As_nH_x$ and $P_nH_x$ (where n is an integer and $x \geq 0$) can be introduced into the vessel and a plasma ignited, followed by the application of a negative bias on the wafer. The bias can be constant in time, time-varying, or pulsed. The use of these clusters will be beneficial since the ratio of dopant atoms to hydrogen (e.g., using $B_{18}H_{22}$ versus $B_2H_6$ and, for example $As_4H_x$ versus $AsH_3$) is greater for hydride clusters than for simple hydrides, and also the dose rates can be much higher when using clusters.

Plasma doping can also be used for carbon cluster implants. More particularly, an analogous argument can be made for using carbon clusters of the form $C_nH_x$ to dope and preamorphize silicon wafers in a plasma doping system, prior to performing the conductive implants using As, B or P. In a plasma doping system, dose can be parametrically controlled by knowing the relationship between pressure of the vapor in the vessel, the temperature, the magnitude of the biasing and the duty cycle of the bias voltage and the ion arrival, rate on the target. It is also possible to directly measure the current on the target. As with beam line implantation, using $C_{16}H_x^+$ ions would yield an 16 times enhancement in dose rate and 18 times higher accelerating voltages required than for $CH_x^+$ ions, for example.

The Importance of Implantation Depth

As the junction requirements become shallower, the boron implant energy must be reduced. Likewise, the carbon implant energy required to effectively reduce diffusion must also be reduced. The use of the carbon cluster or molecule enables very high productivity at very low energies, which is required for advanced technologies. Another critical concern driving the carbon implant process to lower energies is the control of leakage current. Carbon at high concentrations in a junction region is known to endanger low leakage operation. Since most of the active junction is deeper than the source/drain extension junction, carbon at higher energies gets placed exactly in the region of highest leakage risk. One approach to managing this issue is to keep the carbon cluster as shallow as possible, and minimize the dose. In this way, any enhancement of the junction leakage current is minimized.

Pre-Amorphization

A still further advantage supporting the use of carbon implantation with clusters for diffusion control is pre-amorphization. In order to make the boron implant profile as shallow as possible, ion channeling must be avoided. Since the geometry of the transistor formation requires that the implant be performed at normal incidence, tilted implant cannot be used to prevent ion channeling. The conventional approach is to use another implant to destroy the silicon lattice structure prior to performing the boron implant, and this is generally referred to as a "PAI" or pre-amorphization implant. The implant is generally performed using Ge+ ions since they have high mass (and thereby create an amorphous silicon layer at relatively low dose) and the Ge is incorporated into the silicon without much impact on the electrical properties of the devices. However, the Ge implant is difficult and expensive and creates another damage network which risks creating junction leakage. In the proposed technology, the carbon cluster implant provides a PAI benefit because it is a cluster of significant mass. The carbon implant must be performed before the boron implant to have maximum effect, and the use of the cluster thereby also performs the PAI function. A significant reduction of implanted boron depth profile results with this use of the carbon cluster., in accordance with an important aspect of the invention.

Process Flow

There is information in the literature that indicates the carbon implant must be performed before the boron implant to be most effective at controlling diffusion. This means that the carbon implant occurs after gate stack formation and patterning and before the boron SDE implant. The masking operation required is identical to the boron implant, so no additional or modified lithography is required. In fact, the carbon cluster and boron or ClusterBoron implants can be performed in a chain, without removing the wafers from the ion implanter; this is of significant economic benefit on batch tools.

Stress Engineering

It has been shown that carbon incorporated into the source/drain regions of the transistor in silicon can form $Si_xC_y$ material which provides a lattice mismatch to pure silicon and therefore mechanically stresses the transistor channel, increasing carrier mobility, as discussed in the Ang, et al. reference, mentioned above. The $Si_xC_y$ material has a smaller lattice than the silicon, so this material creates tensile stress in the channel which is useful for improving the mobility of NMOS transistors. As such, in accordance with an important aspect of the invention, carbon cluster implantation, such as with $C_{16}H_{10}^+$, is used to perform high dose implants as the means of converting silicon into $Si_xC_y$ selectively in the source/drain regions of an NMOS transistor. At a given ion current, the use of a cluster like $C_{16}H_{10}$ multiplies the carbon dose by a factor of sixteen, and enables ultra shallow implants at high dose An additional benefit of forming the $Si_xC_y$ material by implantation is the control afforded by the implantation equipment. Ion implantation is a successful process in semiconductor manufacturing in general because the accuracy and control of the equipment far surpasses the capability of other forms of semiconductor processing equipment. In particular, for the proposed application, the in-depth profile of carbon concentration can be managed in detail by the control of the implant energy and dose. Indeed, one could envision a sequence of implant steps with various doses and energies to contour the carbon profile to any profile desired. Since it is unclear what detailed process will produce the most advantageous results, the control of carbon profile available via ion implantation will enable a detailed optimization of the final transistor properties A further benefit of using clusters of carbon for incorporating carbon for stress engineering relates to the self-amorphization feature of cluster implantation. For the appropriate stress to be generated, the included carbon must occupy substitution sites with the SiC lattice structure. The degree of inclusion in substitution sites depends on both the means of incorporating the carbon and the temperature exposure of the material. Conventional means of incorporating carbon, whether epitaxial or monomer implant, involve adding carbon to a crystalline structure, while the cluster carbon implant provides a self-amorphized layer. The amorphous layer formed by the cluster carbon implant must be recrystallized, but this is achieved automatically by the annealing of the dopant implants. The recrystallization process, however, promotes incorporation of the carbon into substitution sites. Such process is similar to the incorporation of dopant atoms into substitution sites, which is well known for recrystallization processes.

Method of Incorporating SiC Stress-Engineered Lattice into CMOS Process Flow

In order to create stress engineered devices, the present invention comprises a fairly deep carbon implant, for example about 10 keV per carbon, and at a high dose, between $1E15/cm^2$ and $5E15/cm^2$, into the P-type deep source/drain region, prior to performing the boron or boron cluster S/D implant or SDE implant). This could be either a monomer carbon implant or a cluster carbon implant. The preferred embodiment would comprise a cluster carbon implant. In order to avoid implanting the carbon cluster into the polysilicon gate structure, a nitride cap can be deposited on top of the gate poly. After implanting carbon into the P-type source/drain (S/D) region, a low-temperature anneal can be used to cause the carbon to occupy substitution sites in the Si lattice. A spike anneal of between about 600 C and 900 C, such as a 5 sec RTA treatment, should accomplish the desired result. Data we have produced on bare Si wafers using 10 keV effective C implants using $C_7H_x^+$ implantation at about 80 kV extraction followed by 700 C, 900 C and 1100 C RTA anneals are shown in FIG. 10. The lowest temperature anneals yielded the best results, i.e., the highest strain values. After this anneal, the CMOS structures outlined in FIGS. 12-17 can be performed to make finished, stress-engineered devices. If a nitride cap or other mask barrier was deposited onto the poly gate prior to carbon implantation; then the barrier would be removed before implanting the S/D structures.

Alternatively, on can simply implant carbon as shown in FIG. 11 and forgo the annealing step until the S/D implants have been performed. While there appears to be some loss of stress at higher anneal temperatures, it is not known at this time which anneal sequence will yield the highest mobility devices.

DESCRIPTION OF THE DRAWINGS

These and other advantages of the present invention will be readily understood with reference to the following specification and attached drawing wherein.

DETAILED DESCRIPTION

Figure 1:
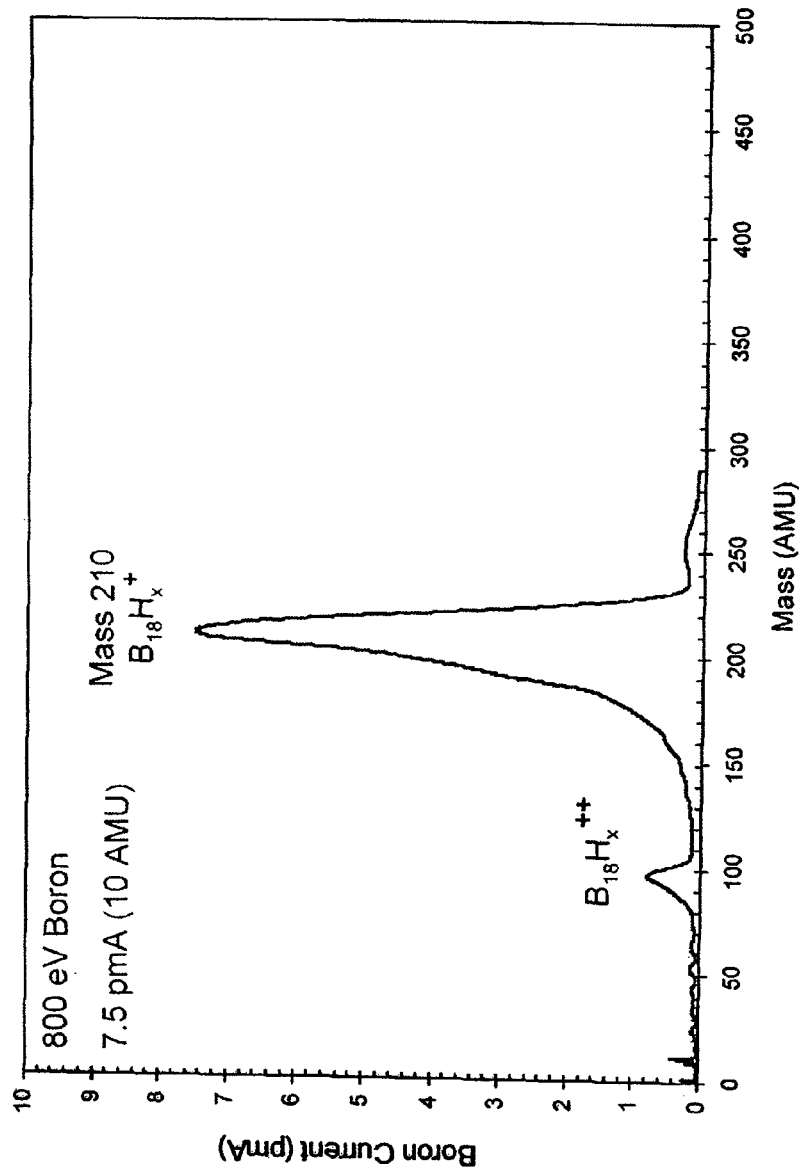
FIG. 1 shows a mass spectrum of $B_{18}H_{22}$ as produced by an ion implantation system.
Figure 2:
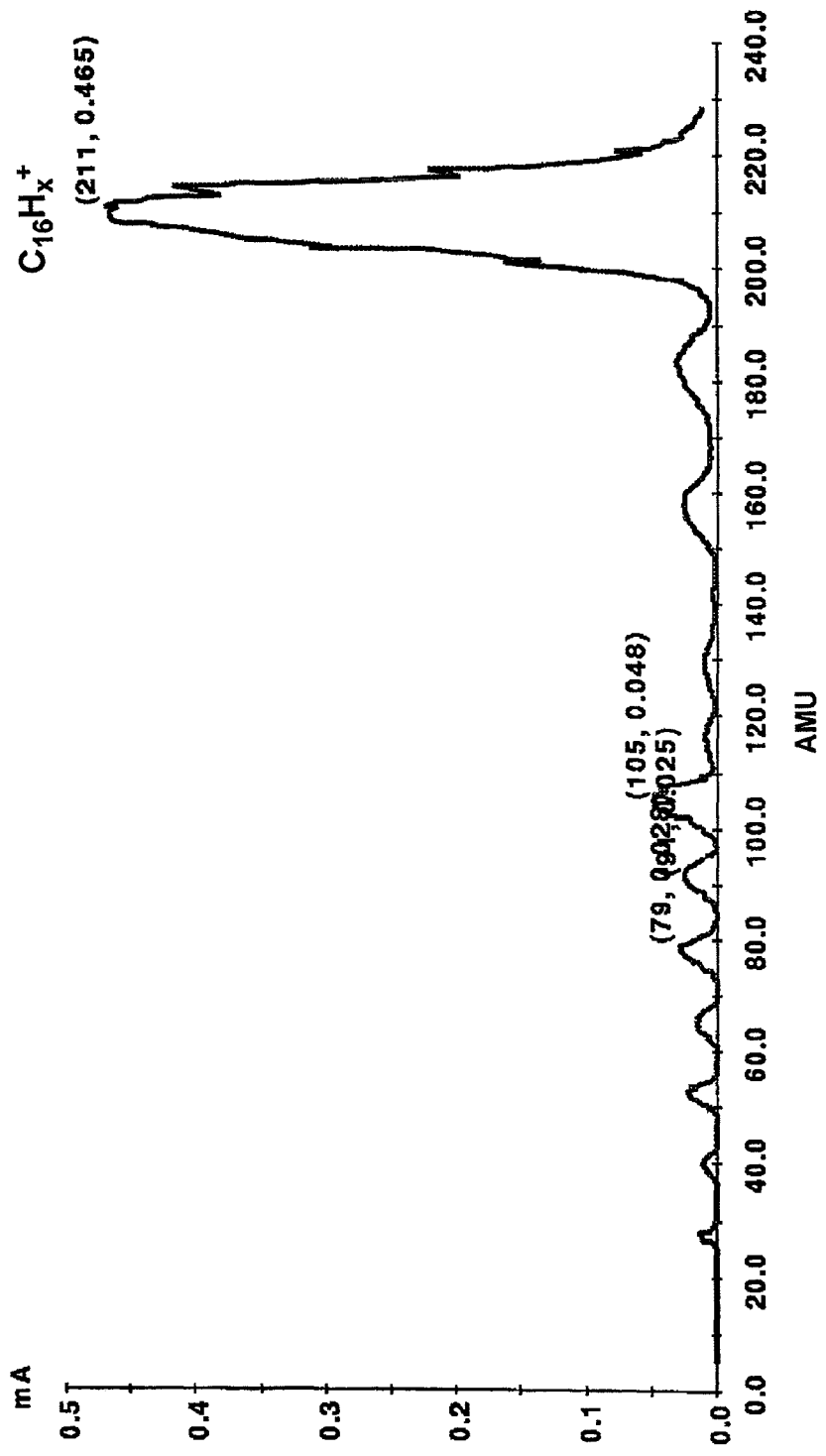
FIG. 2 shows a mass spectrum of $C_{16}H_{10}$ as produced by an ion implantation system.

FIG. 1 shows a mass spectrum of $B_{18}H_{22}$ as produced by an ion implantation system. A ClusterIon® source, for example, as mentioned above, is used to generate ions which are extracted at 20 kV and transported through an analyzer magnet. A resolving aperture at the exist of the magnet provided a modest mass resolution of M/ΔM=15; the beam is scanned across the resolving aperture and the ion current is passed the resolving aperture and measured by a Faraday located about 2 meters from the source. The parent peak at 210 amu is composed of $B_{18}H_x^+$; there is a range of retained H atoms of perhaps 10<x<22 which broadens the peak. The y-axis of the plot is the beam current multiplied by 18 (since there are 18 boron atoms per unit charge), so that the Faraday current was about 400 uA at mass 210. The effective boron implant energy is about 20 kV/20 (since the average natural abundance boron mass is 10.8 amu and the ion mass about 210 amu)=1 keV per boron atom in the cluster. FIG. 2 shows a mass spectrum of fluoranthene, $C_{16}H_{10}$, as produced by an ion implantation system. The parent peak $C_{16}H_{x+}$ is at 211 amu, and the Faraday current was about 500 uA at 17 kV extraction voltage. Thus, the effective implant energy per carbon atom was about 1 keV, and the effective carbon current about 8 mA. Note that the mass, effective current, and implantation energy of the C of FIG. 2 and B of FIG. 1 are about the same. The spectrum of FIG. 2 was generated by placing solid fluoranthene in the vaporizer of an ion source, such as the ClusterIon source, held at 100 C. The source was installed in an ion implanter, for example, an Eaton NV-100 GSD implanter. Wafers were implanted on a batch-style spinning disk to produce the data of FIGS. 3-7.

As is known in the art, the ion source, which forms part of the ion implanter, is used to produce ionized atoms or molecules for implantation into a target substrate. The ion implanter, such as the one mentioned above, selects the ionized molecules of interest and accelerates those molecules into a target by way of an electric field.

Figure 3:
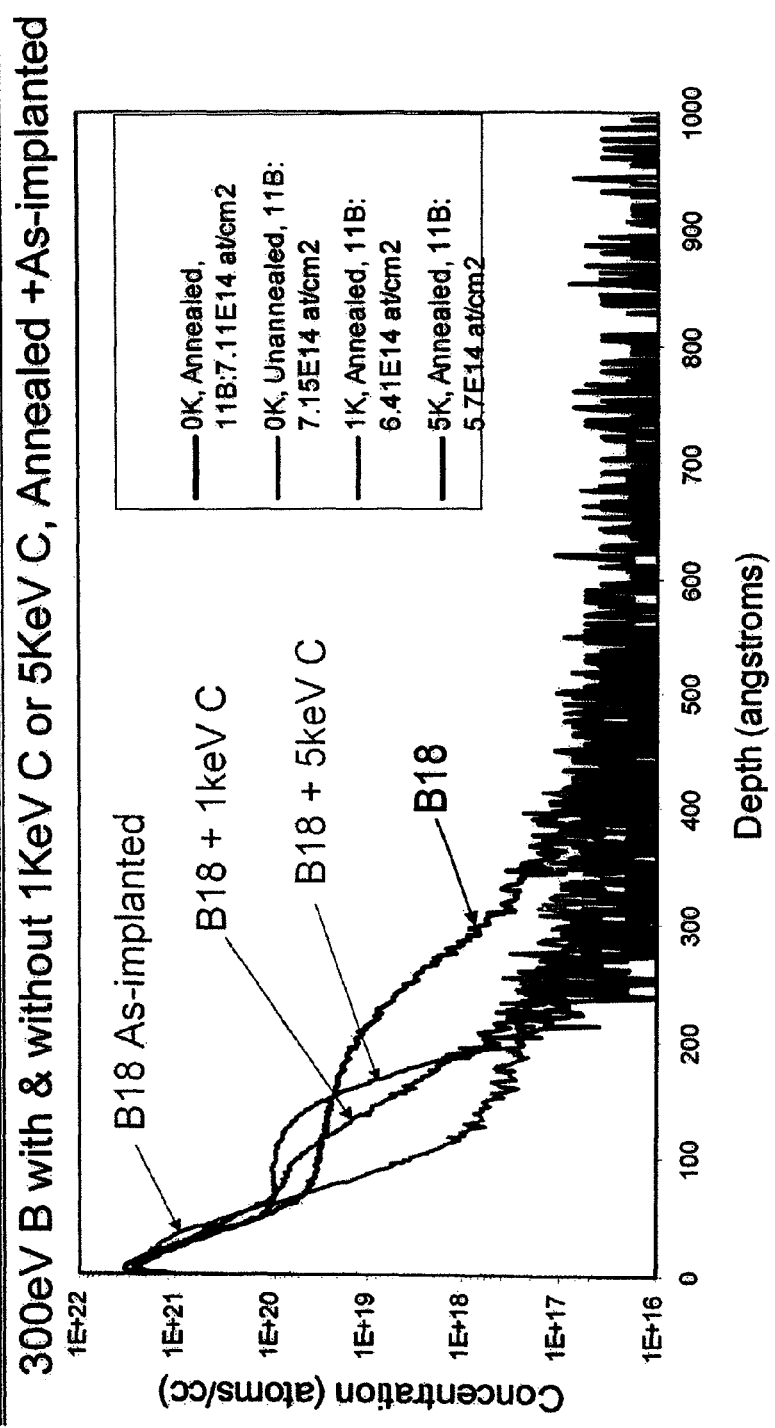
FIG. 3 shows Secondary Ion mass Spectrometry (SIMS) depth profiles of boron implanted into silicon by $B_{18}H_x^+$, and the effect of $C_{16}H_x^+$ co-implantation on the activated profiles.

FIG. 3 shows Secondary Ion Mass Spectrometry (SIMS) depth profiles of boron implanted into silicon by $B_{18}H_x^+$ extracted at 6 kV (yielding an effective per boron implant energy of 300 eV) and the effect of $C_{16}H_x^+$ co-implantation on the activated profiles. The as-implanted profile of a 5.6E13 dose of $B_{18}H_x^+$, i.e., a 1E15 effective boron dose (labeled as B18 As-implanted) was annealed at 950 C for 5 seconds in an Axcelis Summit rapid thermal annealing system (see, for example, www.axcelis.com/products/summitXT.html) for a description of Axcelis's Rapid Thermal Annealing system The post-anneal boron profile is labeled as (B18). The effective junction depth has diffused out from about 10 nm to about 25 nm (we use a dopant concentration of 5E18 $cm^{-2}$ as the reference point for the junction depth) due to transient enhanced diffusion of the boron during the anneal. Other wafers were annealed with this process which were first implanted with a 1E15 dose of either 1 keV, 2 keV, 3 keV, 4 keV, or 5 keV effective carbon dose using the carbon cluster $C_{16}H_x^+$. The annealed boron SIMS profiles for (B18+1 keV C) and, for B18+5 keV C) are shown in FIG. 3. The junction depths are much shallower for these which indicates that the carbon implant has successfully limited the boron diffusion. The shapes of these profiles are also quite different. While the shallowest annealed junction of about 15 nm (as compared to a junction depth of 25 nm without carbon) was obtained by (B18+1 keV C), a very abrupt, box-like junction was obtained by the process (B18+5 keV C) at a junction depth of about 18 nm.

Figure 4:
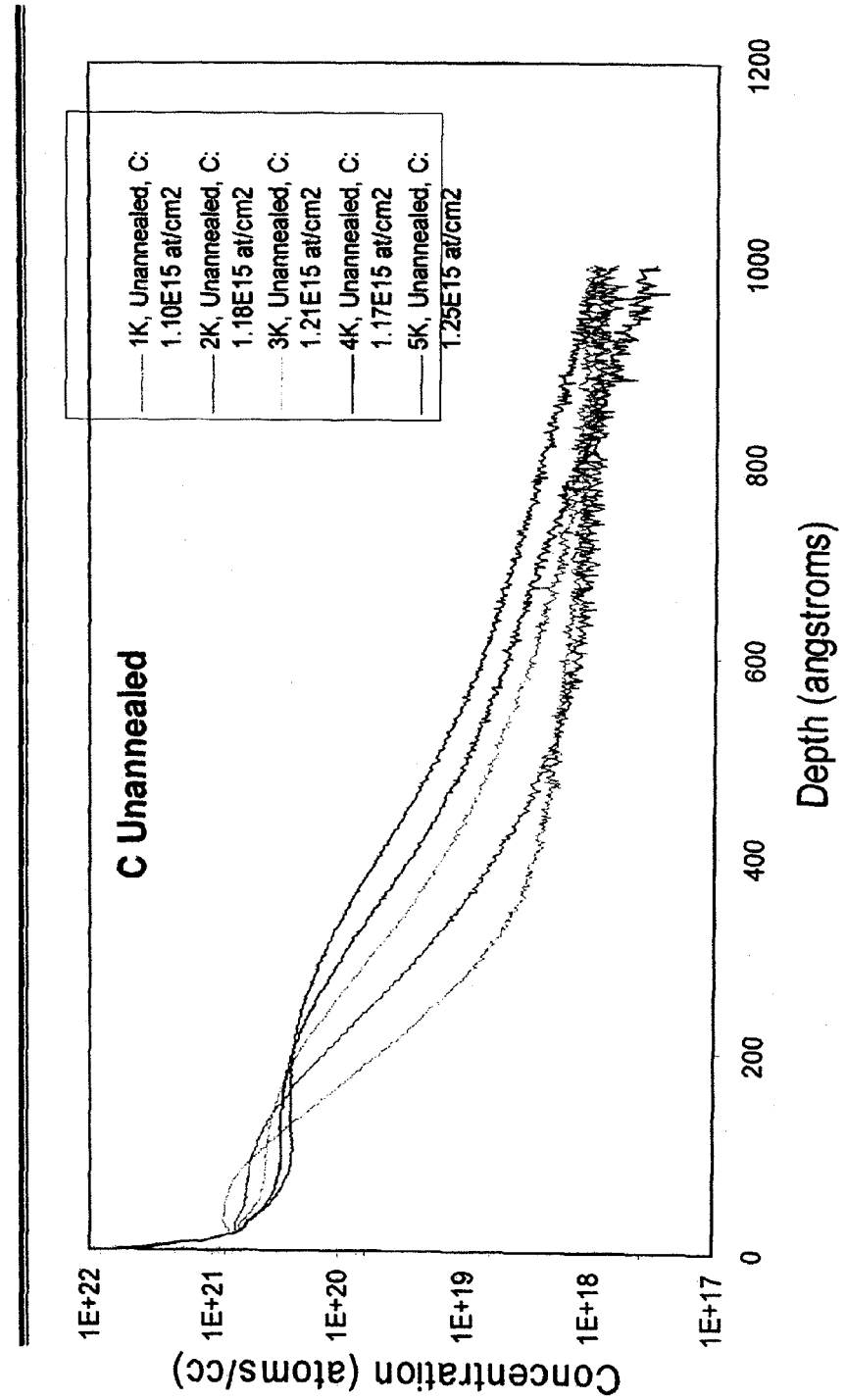
FIG. 4 shows the as-implanted SIMS carbon profiles at 1 keV, 2 keV, 3 keV, 4 keV, and 5 keV carbon implant energies, using $C_{16}H_x^+$.

FIG. 4 shows the as-implanted SIMS carbon profiles at effective implantation energies of 1 keV, 2 keV, 3 keV, 4 keV, and 5 keV, using $C_{16}H_x^+$ at extraction voltages of approximately 17 kV, 34 kV, 51 kV, 68 kV, and 85 kV, respectively. The implantation depths correspond well to those one would obtain using monomer $C^+$ implantation at the effective implant energies.

Figure 5:
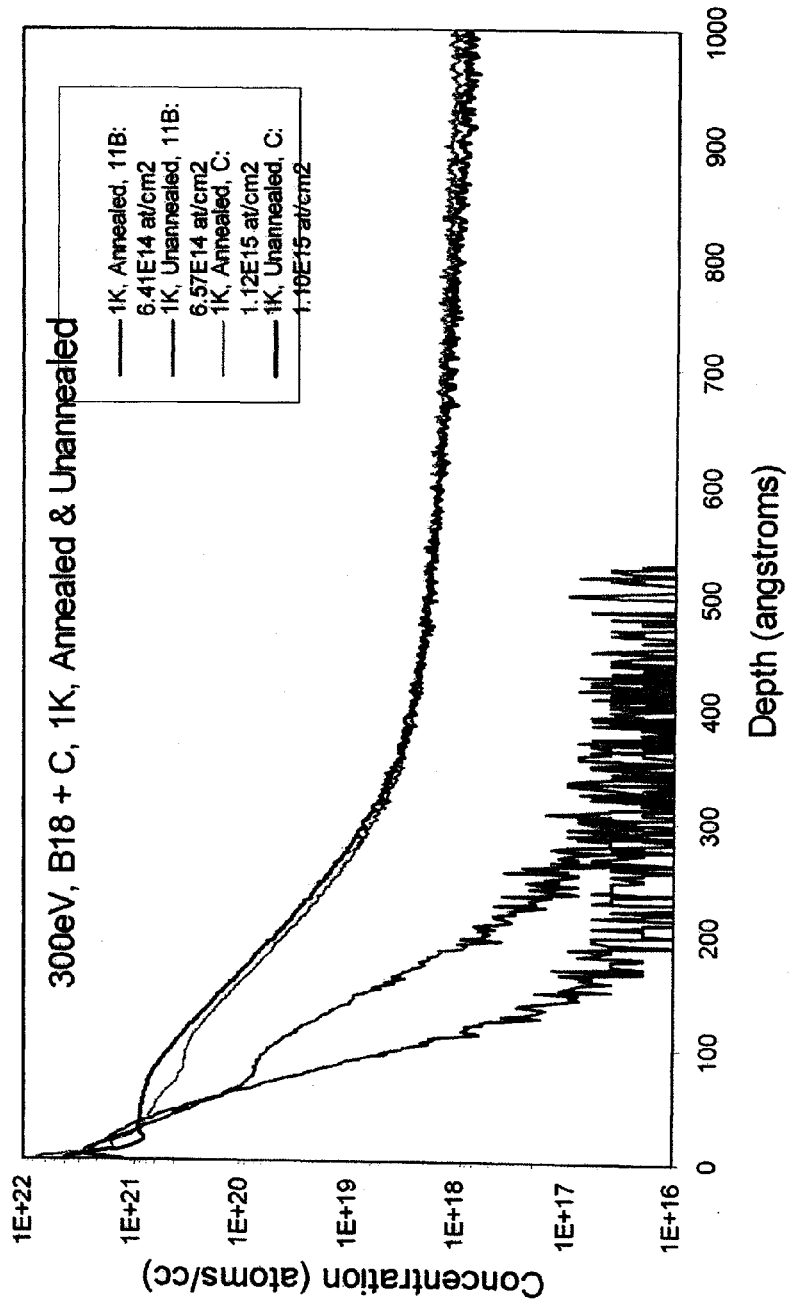
FIG. 5 shows SIMS profiles of 300 eV boron implants, both as-implanted and annealed, after 1 keV carbon implants. The carbon profiles (before and after anneal) are also shown.

FIG. 5 shows SIMS profiles of 300 eV boron implants, both as-implanted and annealed, after 1 keV carbon implants. The carbon profiles (before and after anneal) are also shown, indicating that unlike boron, the carbon does not diffuse or change concentration during the anneal. The as-implanted and annealed boron profiles are similar to those shown in FIG. 3, except that the as-implanted boron profile of FIG. 5 indicates it is free of channeling effects. This is clearly seen when compared to the as-implanted boron profile of FIG. 3, which shows a long deep tail at concentrations below 8E17 $cm^{-2}$. This effect is therefore solely due to the implantation of the carbon cluster which was conducted first in the data of FIG. 5, but not conducted prior to the boron cluster-implant of FIG. 3. Thus, the carbon cluster implant provides two significant benefits: (1) pre-amorphization of the silicon, reducing or eliminating channeling of the subsequent boron implant, and (2) diffusion control during anneal. These two benefits are provided even when the boron implant does not use a cluster, but would work with monomer B as well.

Figure 6:
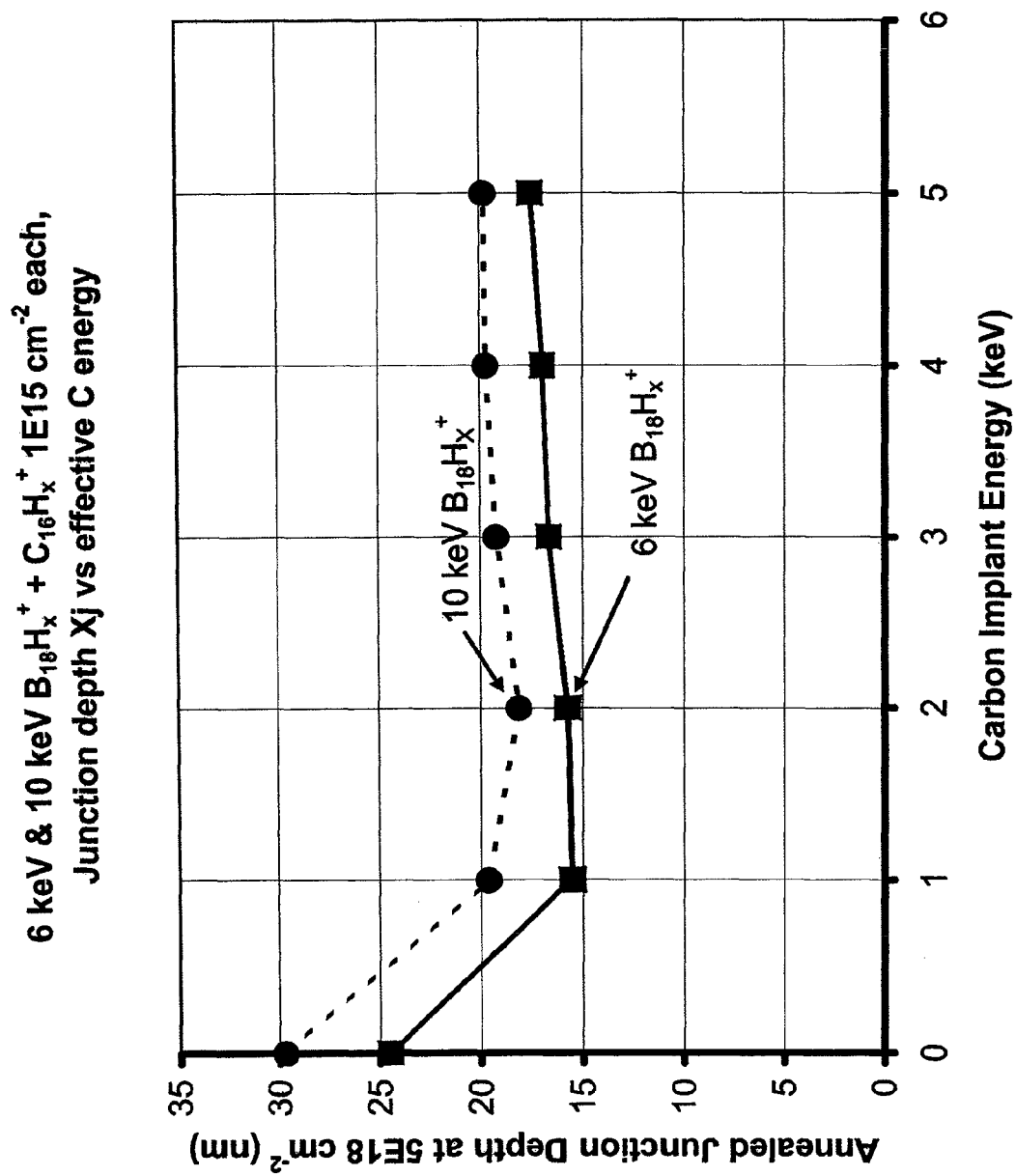
FIG. 6 shows junction depths for various carbon+boron implant conditions.

FIG. 6 shows junction depths for various carbon+boron implant conditions, after anneal. As expected, the 300 eV boron junctions are shallower than the 500 eV junctions. The shallowest junctions are for a carbon implant energy of about 2 keV. There is benefit to implanting carbon shallower rather than deeper, since the risk of generating leakage due to the carbon should be reduced at the shallow (S/D extension region) junction rather than at the deeper (deep S/D region) junction. Ideally, one would want the carbon to be at the same range as the shallowest boron implant to minimize leakage. The use of clusters of carbon enables shallow carbon implants at higher dose than monomer carbon at the lowest implantation energies.

Figure 7:
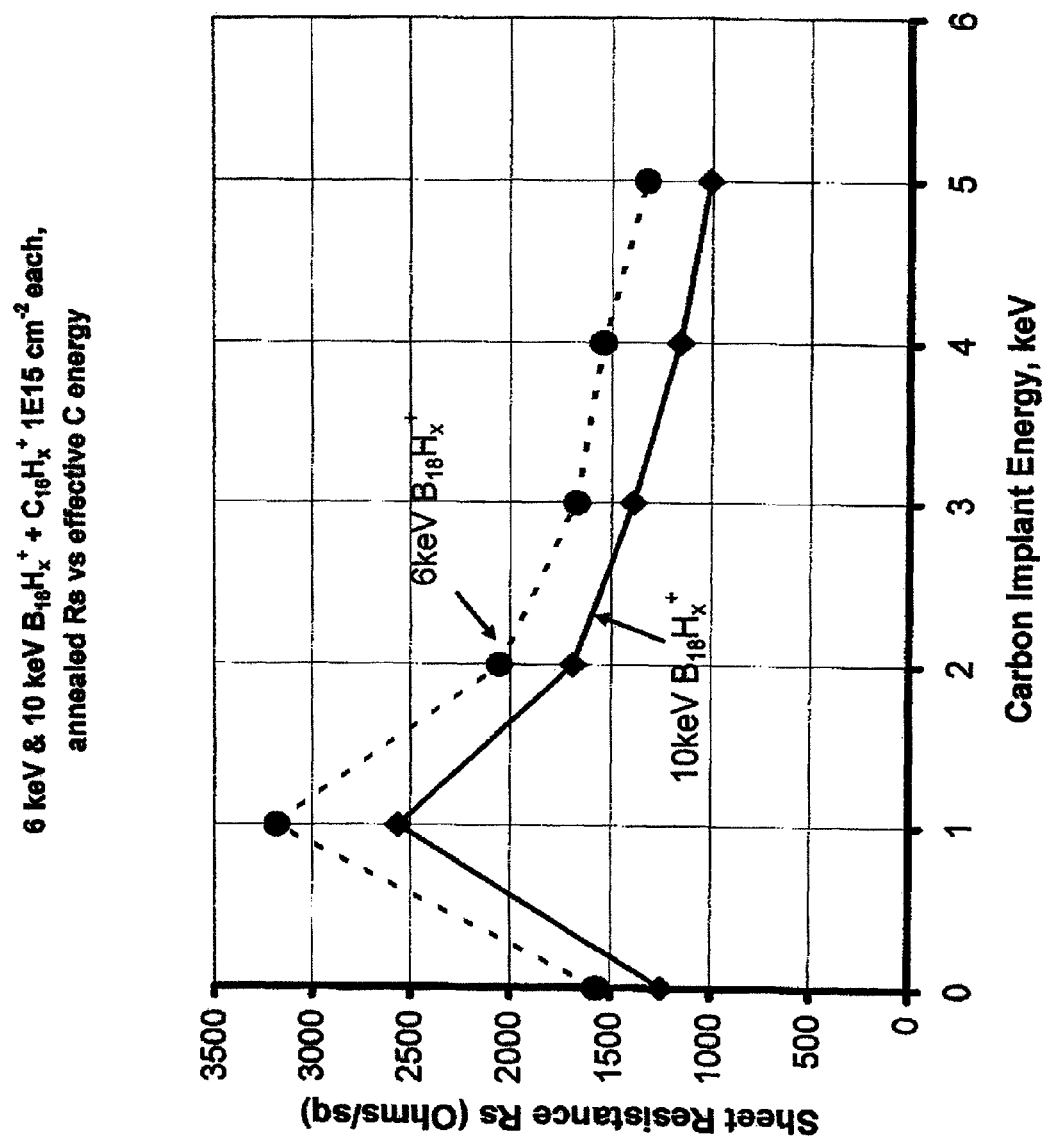
FIG. 7 shows the sheet resistance values associated with the junctions produced in FIG. 6.

FIG. 7 shows the sheet resistance values associated with the junctions produced in FIG. 6. Since shallower junctions tend to produce higher sheet resistances, the trends of FIG. 7 are different than those of FIG. 6. However, the 2 keV carbon+300 eV or 500 eV B data show both a reduction in junction depth and a reduction in sheet resistance, relative to the data using a 1 keV carbon implant. This indicates a real improvement in activation when using the higher carbon energy.

Figure 8:
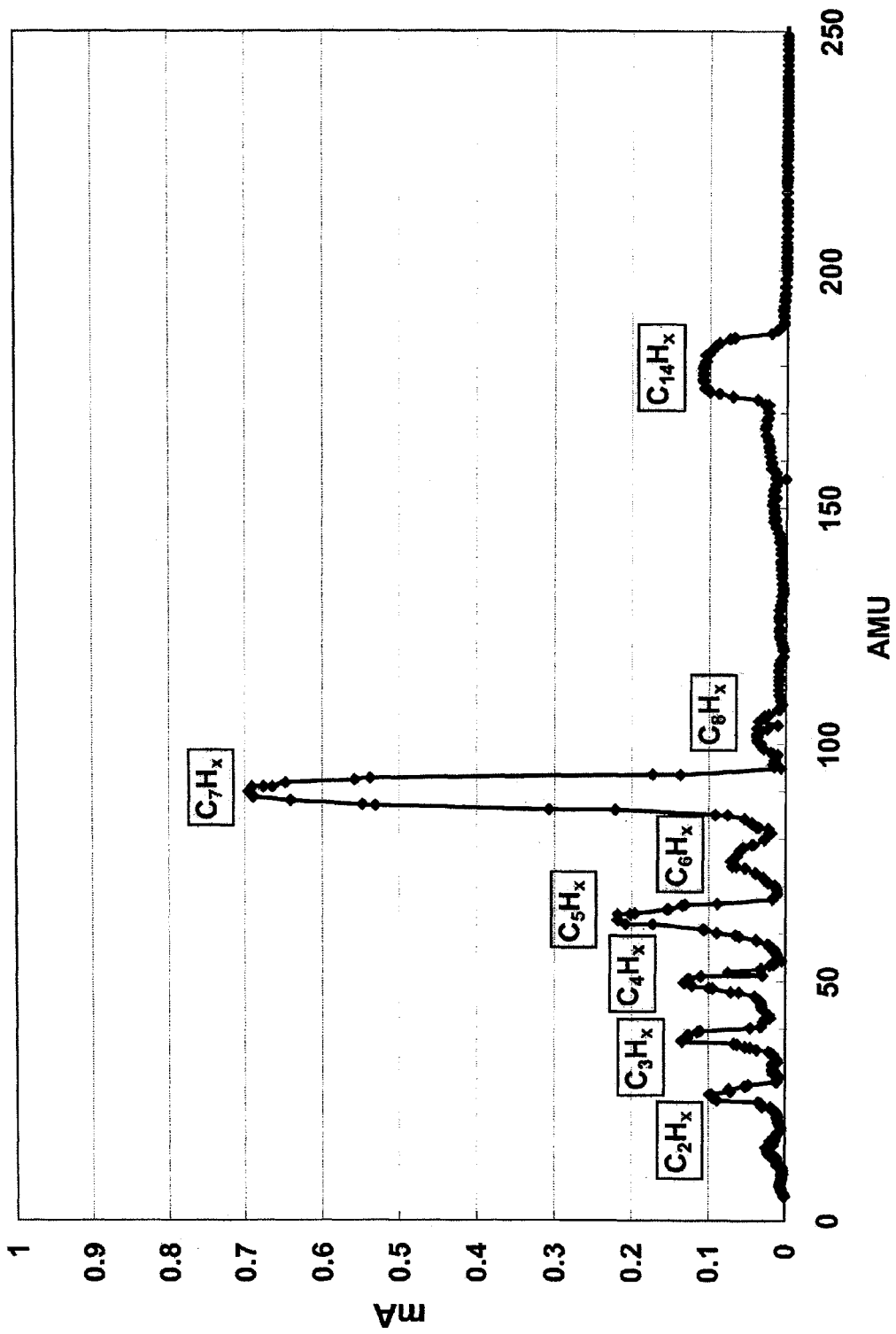
FIG. 8 shows the mass spectrum of an ion beam generated from bibenzyl (also known as dibenzyl or 1,2-diphenylethane), or $C_{14}H_{14}$. The mass spectrum shows a strong peak at 91 amu corresponding to $C_7H_x^+$, ion species, and a range of smaller peaks corresponding to $C_6H_x^+$, $C_5H_x^+$, $C_4H_x^+$, $C_3H_x^+$, and $C_2H_x^+$.

FIG. 8 shows the mass spectrum of an ion beam generated from bibenzyl (also known as dibenzyl or 1,2-diphenylethane), or $C_{14}H_{14}$. The mass spectrum shows a strong peak at about 91 amu corresponding to $C_7H_7^+$ ion species. During ionization the bibenzyl molecule breaks into two $C_7H_7$ molecules. The peak at about 182 amu corresponds to C14H14. It is also seen that ion beams of other carbon cluster species can be formed, such as $C_2H_x^+$, $C_3H_x^+$, $C_4H_x^+$, $C_5H_x$, $C_6H_x^+$, and $C_8H_x^+$ and that these species could be used to implant carbon into silicon, for various technological reasons, such as to implant at higher process energy within the constraint of a given analysis magnet.

Figure 9:
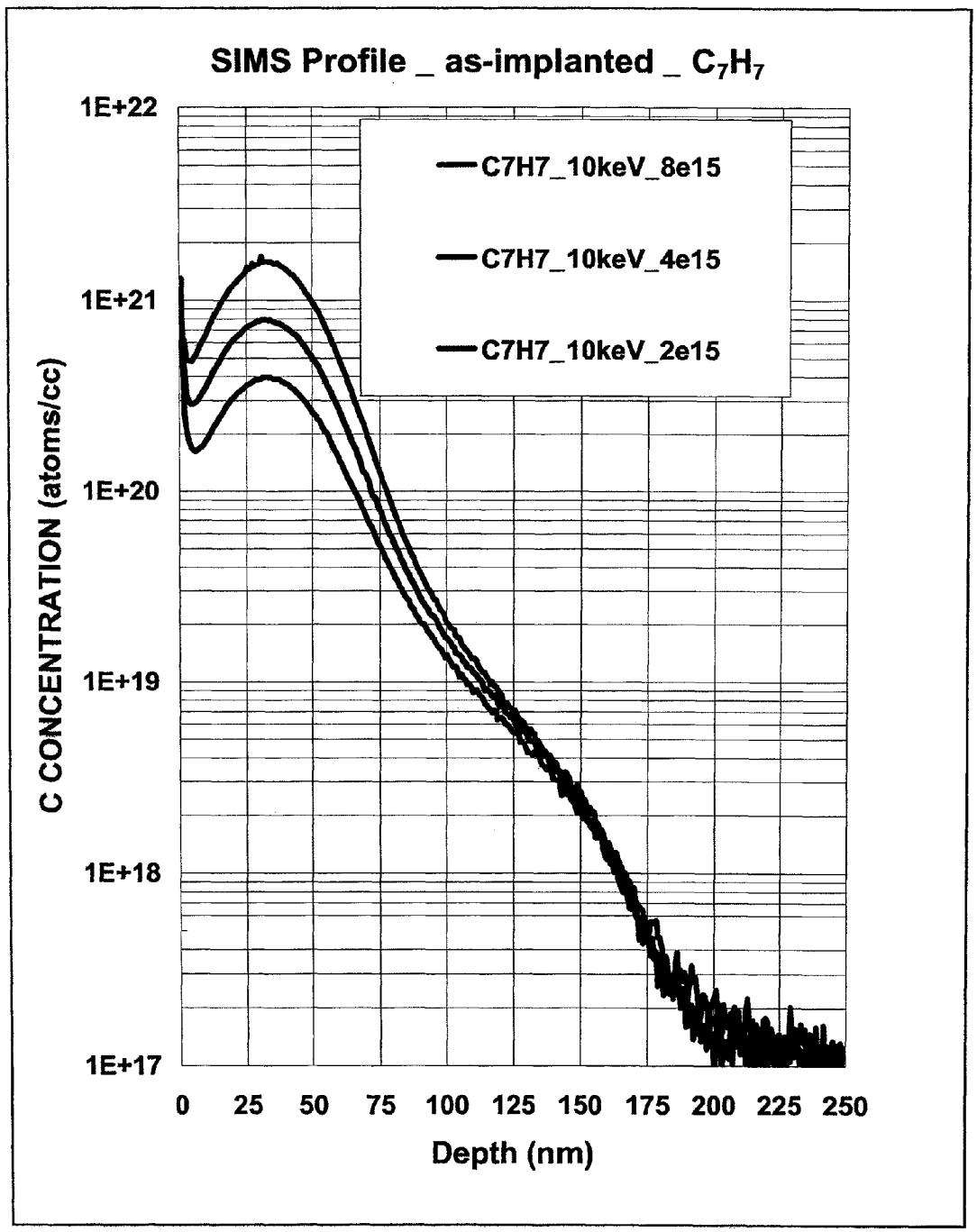
FIG. 9 shows the SIMS profile (carbon concentration versus depth) for $C_7H_7$ implants at 10 keV for three different doses (2E15, 4E15 and 8E15 atoms/cm$^2$).
Figure 10:
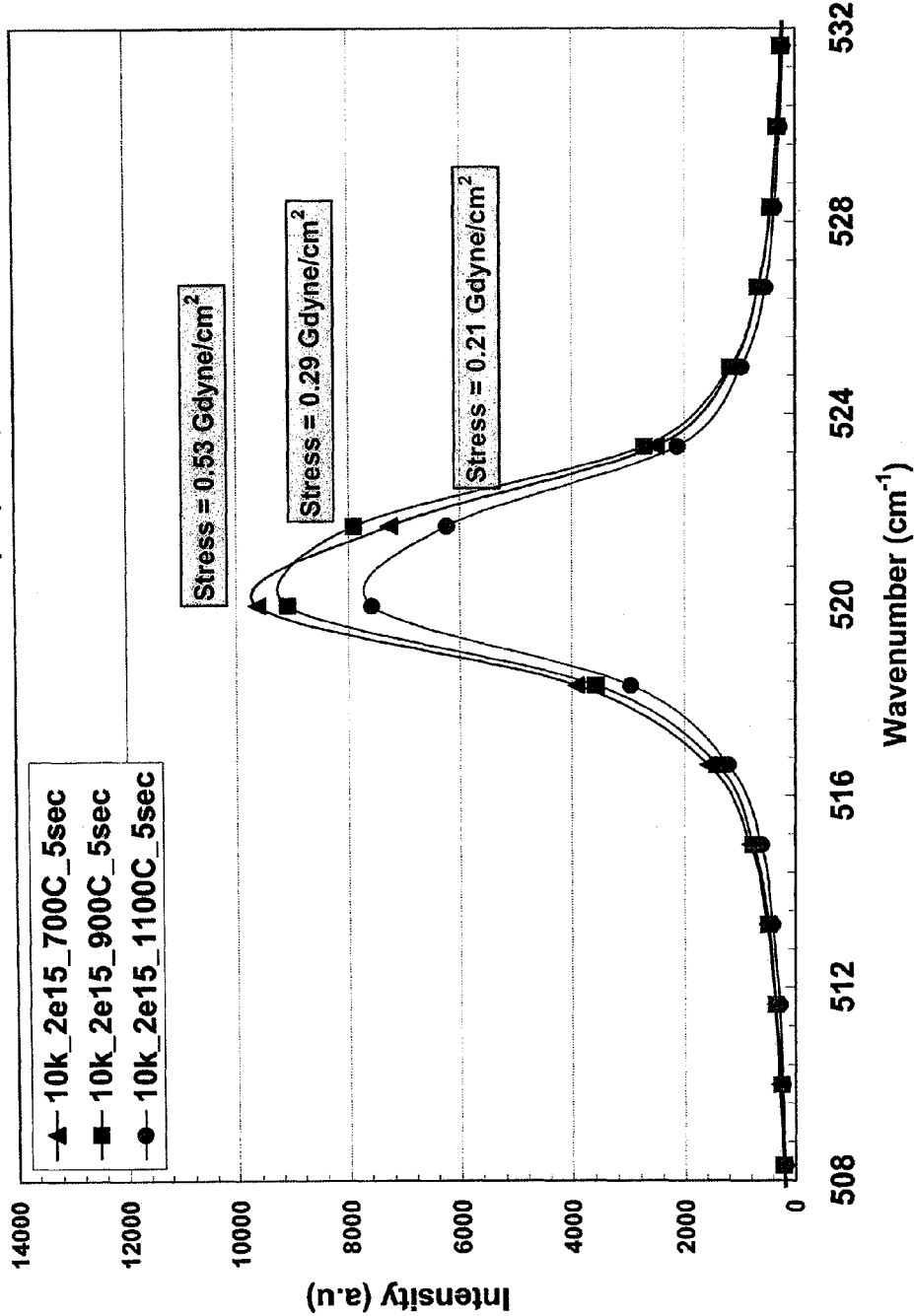
FIG. 10 shows Raman spectra for $C_7H_7$ implant (10 keV per carbon atom) at a 2e15 dose and annealed 700° C., 900° C. & 1100° C. for 5 sec. The shift in Raman peak for each sample was measured and was converted to stress values in Gdyne/cm$^2$.

FIG. 9 shows the SIMS profile (carbon concentration versus depth) for C7H7 implants at 10 keV for three different doses (2E15, 4E15 and 8E15 atoms/cm2). FIG. 10 shows Raman spectra for $C_7H_7$ implant (10 keV per carbon atom) at a 2e15 dose and annealed 700° C., 900° C. & 1100° C. for 5 sec. The shift in Raman peak for each sample was measured and were converted to stress values in Gdyne/cm2. the values obtained show that lower anneal temperature at 700 C gave a higher stress value when compared to higher anneal temperatures. It is shown that significant substitution carbon could be achieved using this carbon molecular implant Formation Of N- And P-Type Shallow Junctions An important application of this method is the use of cluster ion implantation for the formation of N- and P-type shallow junctions as part of a CMOS fabrication sequence. CMOS is the dominant digital integrated circuit technology in current use and its name denotes the formation of both N-channel and P-channel MOS transistors (Complementary MOS: both N and P) on the same chip. The success of CMOS is that circuit designers can make use of the complementary nature of the opposite transistors to create a better circuit, specifically one that draws less active power than alternative technologies. It is noted that the N and P terminology is based on Negative and Positive (N-type semiconductor has negative, majority carriers, and vice versa), and the N-channel and P-channel transistors are duplicates of each other with the type (polarity) of each region reversed. The fabrication of both types, of transistors on the same substrate requires sequentially implanting an N-type impurity and then a P-type impurity, while protecting the other type of devices with a shielding layer of photoresist. It is noted that each transistor type requires regions of both polarities to operate correctly, but the implants which form the shallow junctions are of the same type as the transistor: N-type shallow implants into N-channel transistors and P-type shallow implants into P-channel transistors. An example of this process is shown in FIGS. 12 and 13

Figure 11:
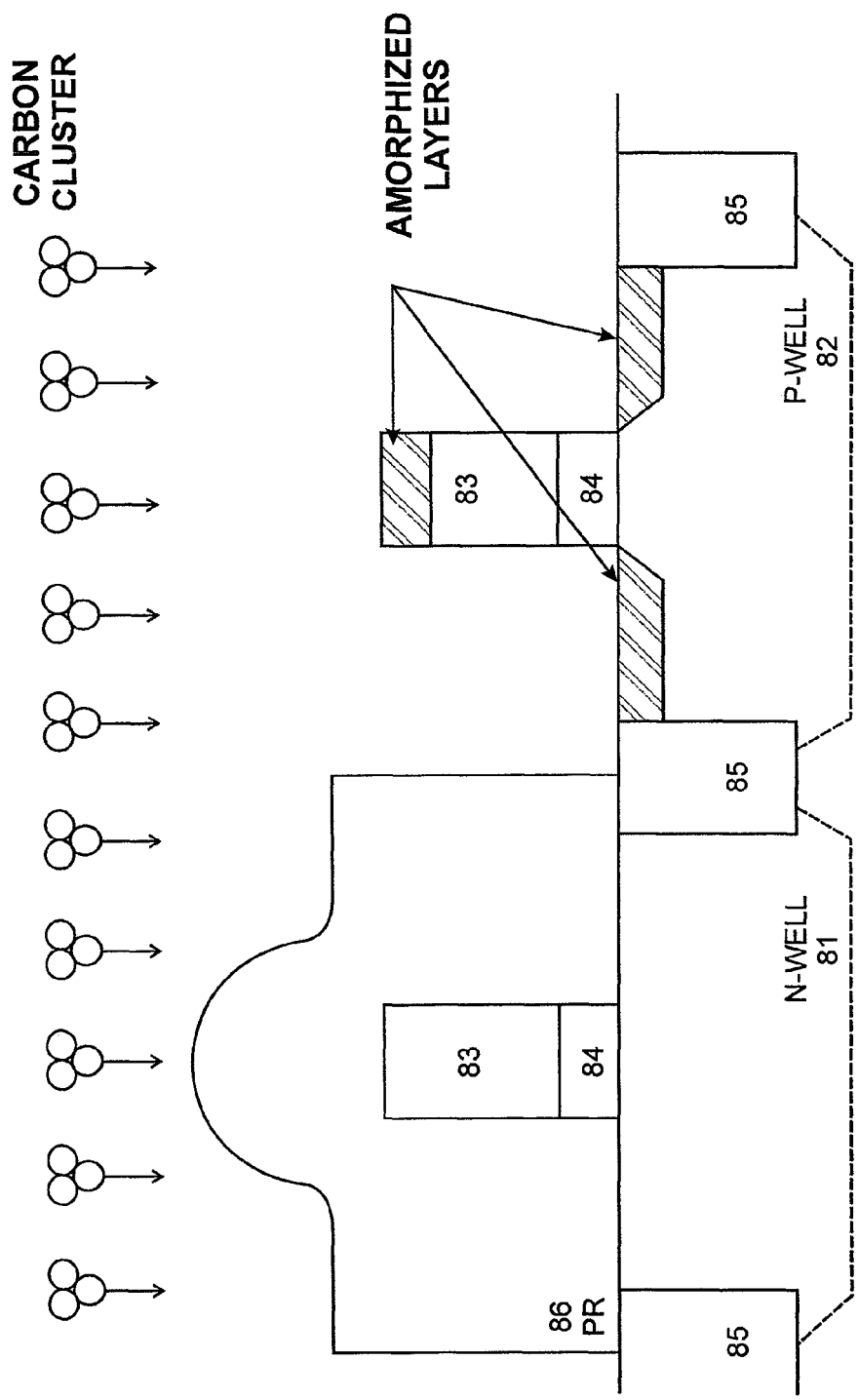
FIG. 11 is a diagram of a CMOS fabrication sequence during formation of carbon doped and amorphized layers by implantation of carbon clusters. The areas corresponding to amorphized layers are shown.

In FIG. 11, a partially completed process is shown. The completed processes include the formation of the wells (N-well 81 and P-well 82), the formation of the trench isolation structure 85, the formation of the gate dielectric 84 and the deposition and patterning of the gate electrode material 83. In addition, the appropriate photo resist mask material 86 has been deposited and patterned for the formation of the NMOS transistor. Within the context of the present invention, first a cluster carbon ion 88 is implanted in the unmasked regions [not 89, a similar but different region] of the substrate in the region that will later become the NMOS Drain Extension and NMOS Source/Drain structures, to a depth of typically 20-50 nm or just below, for example, the junction depth of the intended device, as illustrated in FIG. 11. A Cluster carbon ion implant, as described above, of 3E14 to 2E15 will amorphize a shallow silicon layer, in addition to doping the silicon with carbon.

Figure 12:
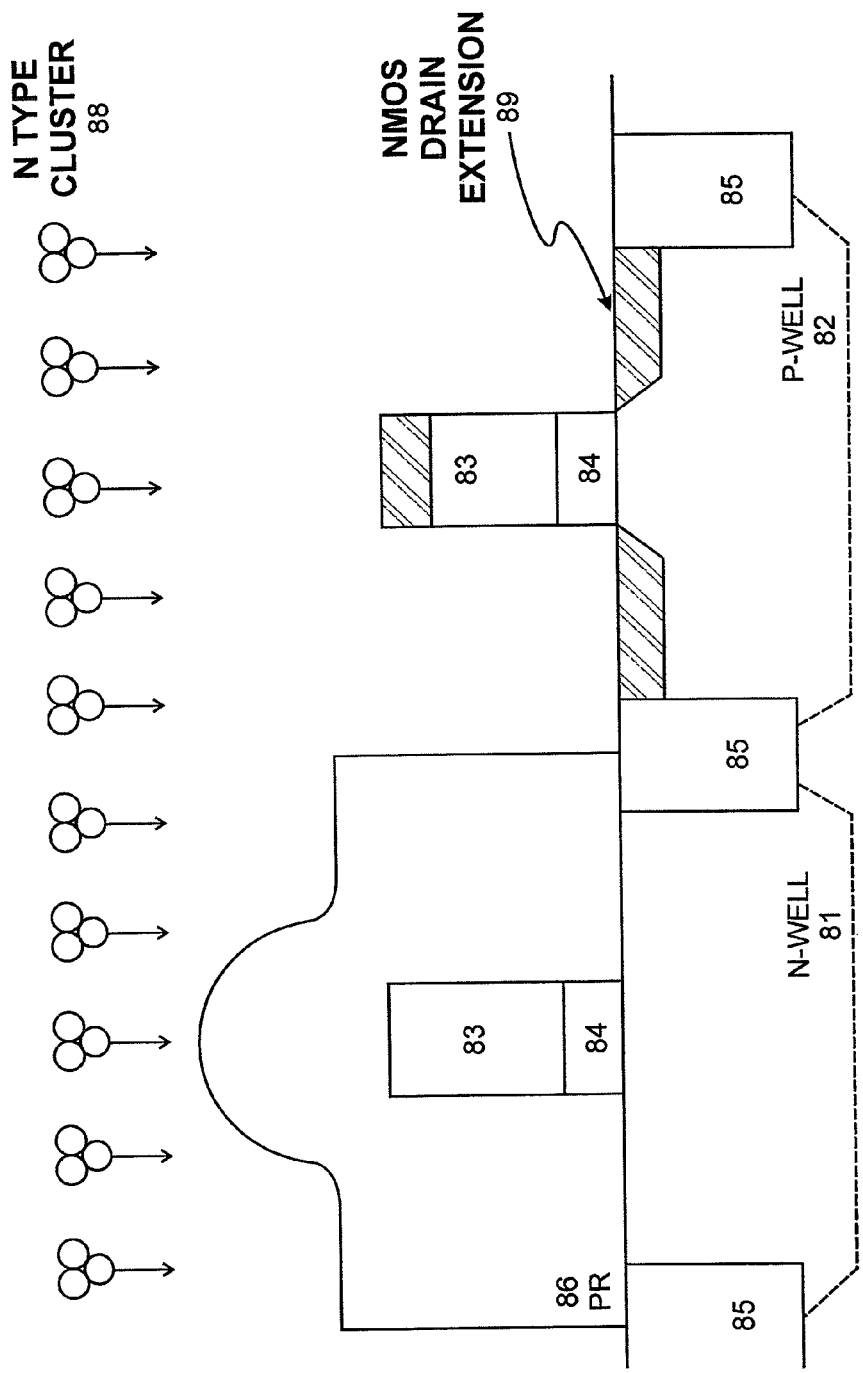
FIG. 12 is a diagram of a CMOS fabrication sequence during formation of the NMOS drain extension.
Figure 13:
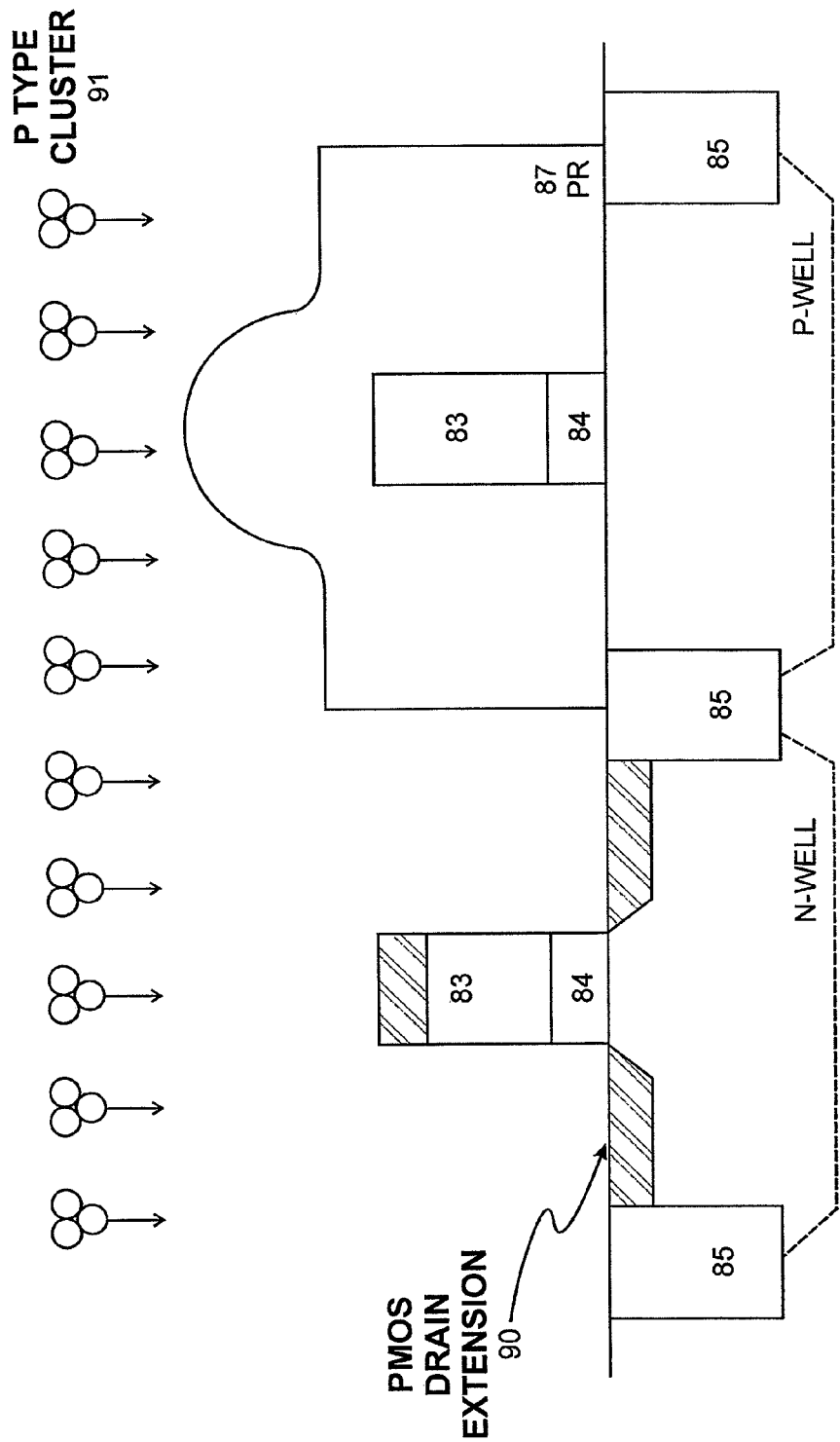
FIG. 13 is a diagram of a CMOS fabrication sequence during formation of the PMOS drain extension.

Once the carbon cluster ion implant is implanted, FIG. 12 illustrates a method for forming the N-channel drain extension 89 through an N-type cluster implant 88, while FIG. 13 shows the formation of the P-channel drain extension 90 by a P-type cluster implant 91. It is to be noted that both N- and P-types of transistors requires shallow junctions of similar geometries, and thus having both N-type and P-type cluster implants is advantageous for the formation of advanced CMOS structures.

Figure 14:
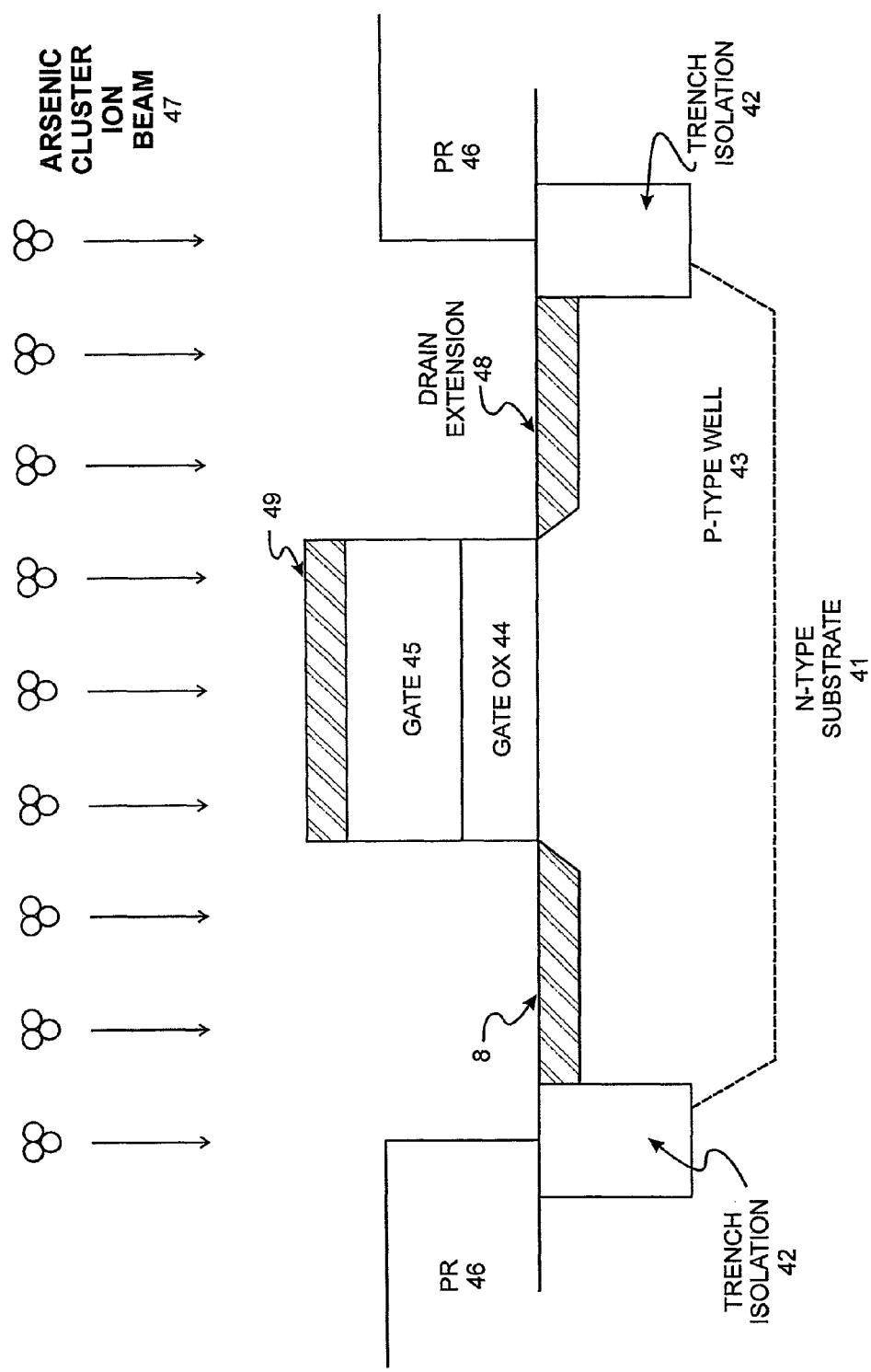
FIG. 14 is a diagram of a semiconductor substrate in the process of manufacturing a NMOS semiconductor device; at the step of N-type drain extension implant.

An example of the application of this method is shown in FIG. 14 for the case of forming an NMOS transistor. This figure shows semiconductor substrate 41 which has undergone some of the front-end process steps of manufacturing a semiconductor device. For example, the structure consists of a N-type semiconductor substrate 41 processed through the P-well 43, trench isolation 42, and gate stack formation 44, 45 steps. An exemplary process for forming the gate stack, P-well and trench isolation is disclosed in International Publication No. WO 2004/003973 A2, published on Jan. 8, 2004, entitled: "An Ion Implantation Device and a Method of semiconductor Manufacturing By the Implantation of Boron Hydride Cluster Ions, hereby incorporated by reference.

An arsenic implant has historically been used to form the NMOS SDE structure, and since As exhibits slow diffusion in silicon, so no additional means are necessary to form the appropriate structure. However, there are issues which may preclude the use of As for the SDE in advanced technologies. For example, phosphorus can be activated in higher concentrations than arsenic, since silicon has a higher solid solubility for phosphorus than for arsenic. Thus, phosphorus may yield lower resistivity S/D regions than arsenic, an important feature since resistivity tends to increase as devices become shallower (smaller), as in advanced devices. In these cases, phosphorus may become a viable alternative, but unlike arsenic, phosphorus exhibits fast diffusion in silicon and so diffusion inhibition by carbon becomes an attractive process. The P-well 43 forms a junction with the N-type substrate 41 that provides junction isolation for the transistors in the well 43. The trench isolation 42 provides lateral dielectric isolation between the N- and P-wells (i.e., in the overall CMOS structure). The gate stack is constructed, with a gate oxide layer 44 and a polysilicon gate electrode 45, patterned to form a transistor gate stack. A photoresist 46 is applied and patterned such that the area for NMOS transistors is exposed, but other areas of the substrate 41 are shielded. After the photoresist 46 is applied, the substrate 41 is ready for the drain extension implant, which is the shallowest doping layer required by the device fabrication process.

A typical process requirement for leading-edge devices of the 0.10 μm technology node is an arsenic implant energy of between 1 keV and 2 keV, and an arsenic dose of $5\times10^{14}\,cm^{-2}$. The cluster ion beam 47, $As_4H_x^+$ in this case, is directed at the semiconductor substrate, typically such that the direction of propagation of the ion beam is normal to the substrate, to avoid shadowing by the gate stack. The energy of the $As_4H_x^+$ cluster should be four times the desired $As^+$ implant energy, e.g., between 4 keV and 8 keV. The clusters dissociate upon impact with the substrate, and the dopant atoms come to rest in a shallow layer near the surface of the semiconductor substrate, which forms the drain extension region 48. It should be noted that the same implant enters the surface layer of the gate electrode 49, providing additional doping for the gate electrode. The process described in FIG. 14 is thus one important application of the proposed invention.

Figure 15:
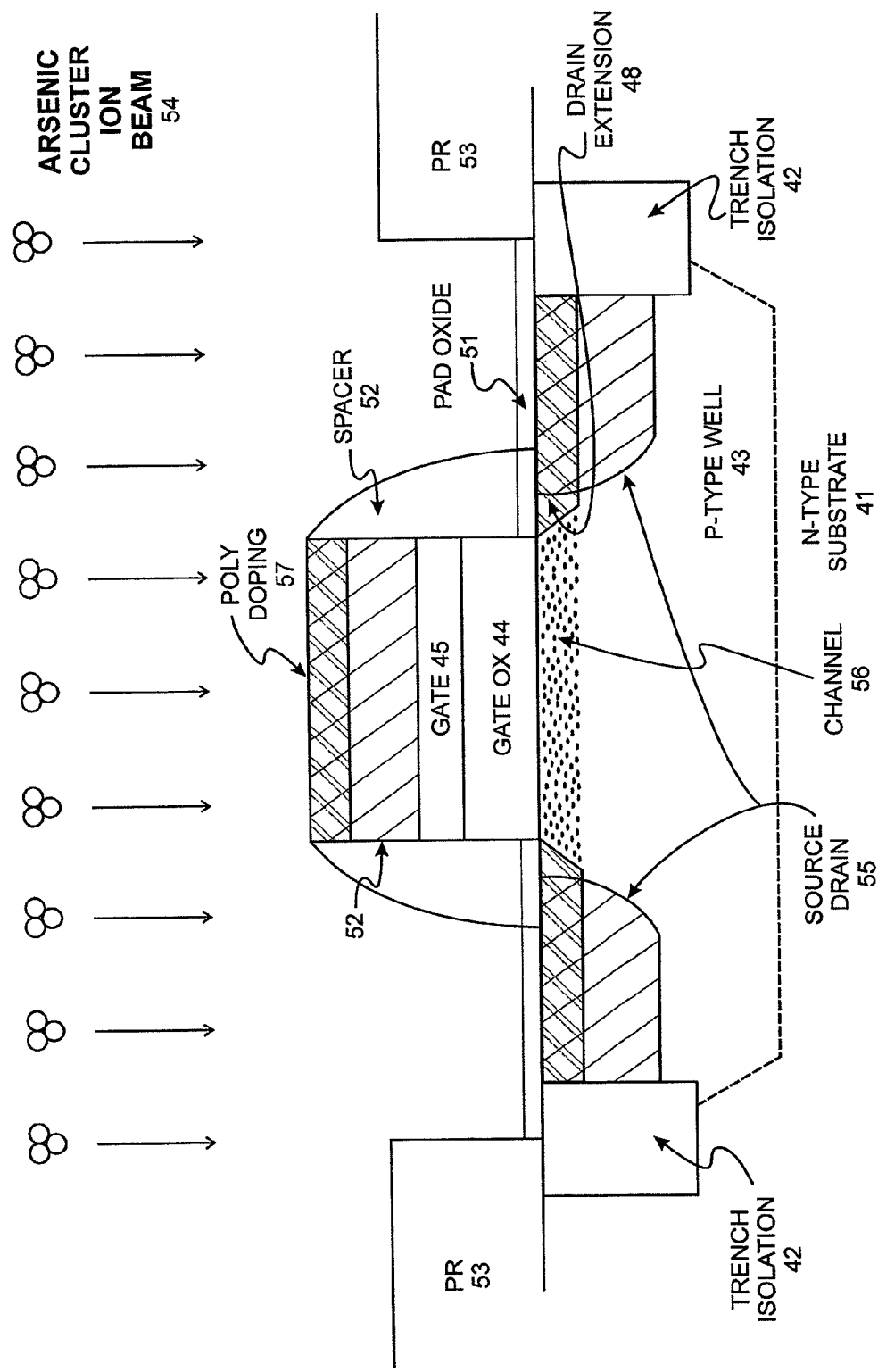
FIG. 15 is a diagram of a semiconductor substrate in the process of manufacturing a NMOS semiconductor device, at the step of the source/drain implant.

A further example of the application of this method is shown in FIG. 15: the formation of the deep source/drain regions. This figure shows the semiconductor substrate 41 of FIG. 14 after execution of further processes steps in the fabrication of a semiconductor device. The additional process steps include the formation of a pad oxide 51 and the formation of spacers 52 on the sidewalls of the gate stack. Reiterating the process steps described in FIG. 14 but identified in FIG. 15 for clarity, The P-well 43 forms a junction with the N-type substrate 41 that provides junction isolation for the transistors in the well 43. The trench isolation 42 provides lateral dielectric isolation between the N- and P-wells (i.e., in the overall CMOS structure). The gate stack is constructed, with a gate oxide layer 44 and a polysilicon gate electrode 45, patterned to form a transistor gate stack. A photoresist 46 is applied and patterned such that the area for NMOS transistors is exposed, but other areas of the substrate 41 are shielded. After the photoresist 46 is applied. The cluster ion beam 54, $As_4H_x^+$ in this case, although a phosphorus implant of similar dose may be used instead, is directed at the semiconductor substrate, typically such that the direction of propagation of the ion beam is normal to the substrate, to avoid shadowing by the gate stack. The dopant atoms come to rest in a shallow layer near the surface of the semiconductor substrate, which forms the drain extension region 48. It should be noted that the same implant enters the surface layer of the gate electrode 49, providing additional doping for the gate electrode. The pad oxide 51 is a thin layer of oxide (silicon dioxide) used to protect the exposed substrate areas, the top of the gate electrode 49 and the potentially exposed gate dielectric edge. The pad oxide 51 is typically thermally grown to a thickness of 5-10 nm. The spacer 52, on the other hand, is a region of dielectric, either silicon dioxide, silicon nitride, or a combination of these, which resides on the side of the gate stack and serves to insulate the gate electrode. It also serves as an alignment guide for the source/drain implant (e.g., 54), which must be spaced back from the gate edge for the transistor to operate properly. The spacers 52 are formed by the deposition of silicon dioxide and/or silicon nitride layers which are then plasma etched in a way to leave a residual layer on the side of the gate stack while clearing the dielectrics from the source/drain region. After etching the spacers 52, a photoresist layer 53 is applied and patterned to expose the transistor to be implanted, an NMOS transistor in this example. Next, the ion implant to form the source and drain regions 55 is performed. Since this implant requires a high dose at low energy, it is an appropriate application of the proposed cluster implantation method. Typical implant parameters for the 0.13 um technology node are approximately 6 keV per arsenic atom (54) at an arsenic dose of $5 \times 10^{15}$ cm$^{-2}$, so it requires a 24 keV, $1.25 \times 10^{15}$ cm$^{-2}$ As$_4$H$_x^+$ implant, a 12 keV, $2.5 \times 10^{15}$ cm$^{-2}$ As$_2$H$_x^+$ implant, or a 6 keV, $5 \times 10^{15}$ cm$^{-2}$ As$^+$ implant.

As shown in FIG. 14, the source and drain regions 55 are formed by this implant. These regions provide a high conductivity connection between the circuit interconnects (to be formed later in the process) and the intrinsic transistor defined by the drain extension 48 in conjunction with the channel region 56 and the gate stack 44, 45. The gate electrode 45 can be exposed to this implant (as shown), and if so, the source/drain implant provides the primary doping source for the gate electrode. This is shown in FIG. 15 as the poly doping layer 57.

Figure 16:
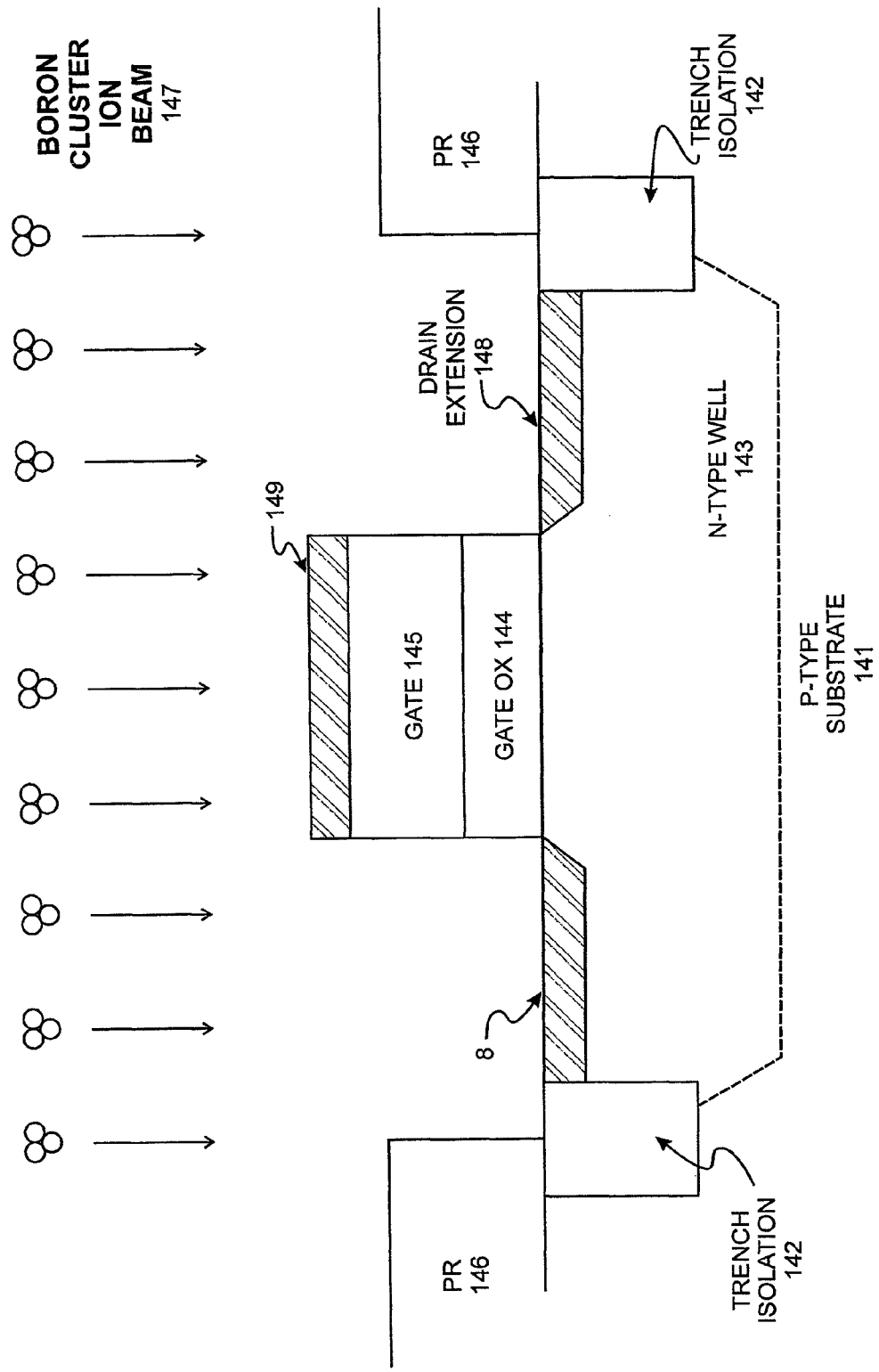
FIG. 16 is a diagram of a semiconductor substrate in the process of manufacturing an PMOS semiconductor device, at the step of P-type drain extension implant.
Figure 17:
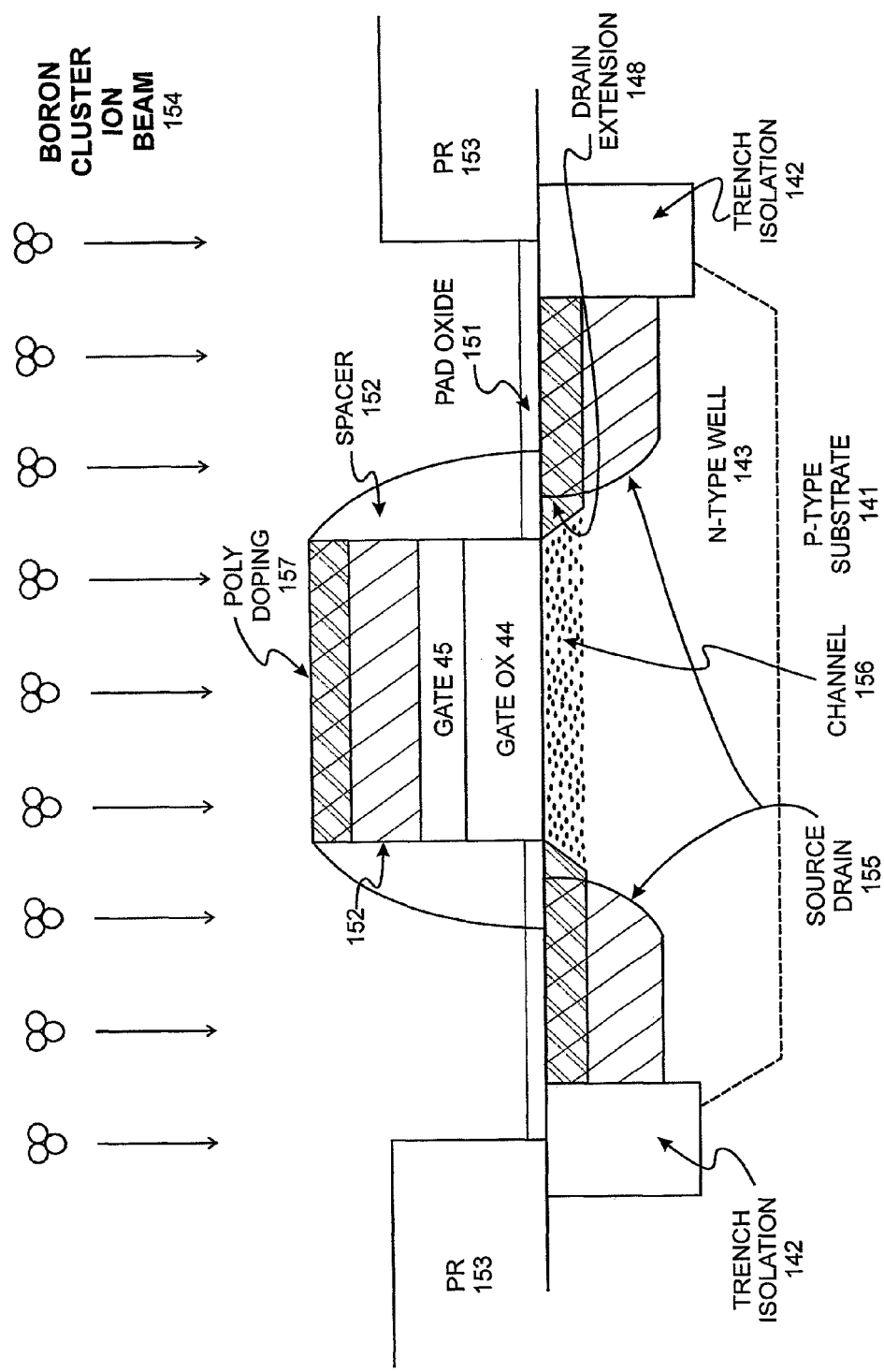
FIG. 17 is a diagram of a semiconductor substrate in the process of manufacturing a PMOS semiconductor device, at the step of the source/drain implant.

The detailed diagrams showing the formation of the PMOS drain extension 148 and PMOS source and drain regions 155 are shown in FIGS. 16 and 17, respectively. The structures and processes are the same as in FIGS. 15 and 16 with the dopant types reversed. Thus, FIG. 16 shows semiconductor substrate 141 which has undergone some of the front-end process steps of manufacturing a semiconductor device. For example, the structure consists of a P-type semiconductor substrate 141 processed through the N-well 143, trench isolation 142, and gate stack formation 144, 145 steps. A boron implant has historically been used to form the PMOS SDE structure, however in the present invention a boron cluster ion such as $B_{18}H_x^+$ is used.

The N-well 143 forms a junction with the P-type substrate 141 that provides junction isolation for the transistors in the well 143. The trench isolation 142 provides lateral dielectric isolation between the N- and P-wells (i.e., in the overall CMOS structure). The gate stack is constructed, with a gate oxide layer 144 and a polysilicon gate electrode 145, patterned to form a transistor gate stack. A photoresist 146 is applied and patterned such that the area for PMOS transistors is exposed, but other areas of the substrate 141 are shielded. After the photoresist 146 is applied, the substrate 141 is ready for the drain extension implant, which is the shallowest doping layer required by the device fabrication process. A typical process requirement for leading-edge devices of the 0.10 μm technology node is a boron implant energy of between 0.5 keV and 1 keV, and an boron dose of $5 \times 10^{14}$ cm$^{-2}$. The cluster ion beam 147, $B_{18}H_x^+$ in this case, is directed at the semiconductor substrate, typically such that the direction of propagation of the ion beam is normal to the substrate, to avoid shadowing by the gate stack. The energy of the $B_{18}H_x^+$ cluster should be 20 times the desired $B^+$ implant energy, e.g., between 10 keV and 20 keV, and the $B_{18}H_x^+$ dose should be one-eighteenth of the boron dose, about 2.8E13. The clusters dissociate upon impact with the substrate, and the dopant atoms come to rest in a shallow layer near the surface of the semiconductor substrate, which forms the drain extension region 148. It should be noted that the same implant enters the surface layer of the gate electrode 149, providing additional doping for the gate electrode. The process described in FIG. 16 is thus one important application of the proposed invention.

A further example of the application of this method is shown in FIG. 17: the formation of the deep source/drain regions. This figure shows the semiconductor substrate 141 of FIG. 16 after execution of further processes steps in the fabrication of a semiconductor device. The additional process steps include the formation of a pad oxide 151 and the formation of spacers 152 on the sidewalls of the gate stack. Reiterating the process steps described in FIG. 16 but identified in FIG. 17 for clarity, The N-well 143 forms a junction with the P-type substrate 141 that provides junction isolation for the transistors in the well 143. The trench isolation 142 provides lateral dielectric isolation between the N- and P-wells (i.e., in the overall CMOS structure). The gate stack is constructed, with a gate oxide layer 144 and a polysilicon gate electrode 145, patterned to form a transistor gate stack. A photoresist 146 is applied and patterned such that the area for PMOS transistors is exposed, but other areas of the substrate 141 are shielded. After the photoresist 146 is applied. The cluster ion beam 154, $B_{18}H_x^+$ in this case is directed at the semiconductor substrate, typically such that the direction of propagation of the ion beam is normal to the substrate, to avoid shadowing by the gate stack. The dopant atoms come to rest in a shallow layer near the surface of the semiconductor substrate, which forms the drain extension region 148. It should be noted that the same implant enters the surface layer of the gate electrode 149, providing additional doping for the gate electrode. The pad oxide 151 is a thin layer of oxide (silicon dioxide) used to protect the exposed substrate areas, the top of the gate electrode 149 and the potentially exposed gate dielectric edge. The pad oxide 151 is typically thermally grown to a thickness of 5-10 nm. The spacer 152, on the other hand, is a region of dielectric, either silicon dioxide, silicon nitride, or a combination of these, which resides on the side of the gate stack and serves to insulate the gate electrode. It also serves as an alignment guide for the source/drain implant (e.g., 154), which must be spaced back from the gate edge for the transistor to operate properly. The spacers 152 are formed by the deposition of silicon dioxide and/or silicon nitride layers which are then plasma etched in a way to leave a residual layer on the side of the gate stack while clearing the dielectrics from the source/drain region.

After etching the spacers 52, a photoresist layer 53 is applied and patterned to expose the transistor to be implanted, a PMOS transistor in this example. Next, the ion implant to form the source and drain regions 155 is performed. Since this implant requires a high dose at low energy, it is an appropriate application of the proposed cluster implantation method. Typical implant parameters for the 0.10 um technology node are approximately 4 keV per boron atom (154) at a boron dose of $5 \times 10^{15}$ cm$^{-2}$, so it requires an 80 keV, $2.8 \times 10^{14}$ cm$^{-2}$ $B_{18}H_x^+$ implant, or a 4 keV, $5 \times 10^{15}$ cm$^{-2}$ $B^+$ implant. These regions provide a high conductivity connection between the circuit interconnects (to be formed later in the process) and the intrinsic transistor defined by the drain extension 148 in conjunction with the channel region 156 and the gate stack 144, 145. The gate electrode 145 can be exposed to this implant (as shown), and if so, the source/drain implant provides the primary doping source for the gate electrode. This is shown in FIG. 17 as the poly doping layer 157.

In general, ion implantation alone is not sufficient for the formation of an effective semiconductor junction: a heat treatment is necessary to electrically activate the implanted dopants. After implantation, the semiconductor substrate's crystal structure is heavily damaged (substrate atoms are moved out of crystal lattice positions), and the implanted dopants are only weakly bound to the substrate atoms, so that the implanted layer has poor electrical properties. A heat treatment, or anneal, at high temperature (greater than 900 C) is typically performed to repair the semiconductor crystal structure, and to position the dopant atoms substitution ally, i.e., in the position of one of the substrate atoms in the crystal structure. This substitution allows the dopant to bond with the substrate atoms and become electrically active; that is, to change the conductivity of the semiconductor layer. This heat treatment works against the formation of shallow junctions, however, because diffusion of the implanted dopant occurs during the heat treatment. Boron diffusion during heat treatment, in fact, is the limiting factor in achieving USJ's in the sub-0.1 micron regime. Advanced processes have been developed for this heat treatment to minimize the diffusion of the shallow implanted dopants, such as the "spike anneal". The spike anneal is a rapid thermal process wherein the residence time at the highest temperature approaches zero: the temperature ramps up and down as fast as possible. In this way, the high temperatures necessary to activate the implanted dopant are reached while the diffusion of the implanted dopants is minimized. It is anticipated that such advanced heat treatments would be utilized in conjunction with the present invention to maximize its benefits in the fabrication of the completed semiconductor device. In particular, the implanted carbon reduces the transient enhanced diffusion of dopant during the thermal activation process.

Obviously, many modifications and variations of the present invention are possible in light of the above teachings. Thus, it is to be understood that, within the scope of the appended claims, the invention may be practiced otherwise than is specifically described above What is desired to be secured by a Letters Patent is set forth in the appended claims:

We claim:

1. A method of implanting ions comprising the steps of:
   (a) producing a volume of gas phase molecules of material of the form $C_nH_x$ wherein n and x are integers, and $2 \leq n$, and $x \geq 0$;
   (b) ionizing the $C_nH_x$ molecules to form $C_nH_y^+$ or $C_nH_y^-$ ions by electron impact ionization, wherein y is an integer such that y>=0; and
   (c) implanting the ionized molecules by an electric field into a target.

2. A method of implanting ions comprising the steps of:
   (a) producing a volume of gas phase molecules of material of the form $C_nH_x$ molecules, wherein n and x are integers, and $2 \leq n$ and $x \geq 0$;
   (b) ionizing the $C_nH_x$ molecules to form $C_nH_x^+$ ions by electron impact ionization, where n and x are integers and $2 \leq n$ and $x \geq 0$; and
   (c) implanting the ionized molecules by an electric field into a target.

3. A method of doping a semiconductor comprising the steps of:
   (a) generating ions of the form $C_nH_x^+$ ions, where n and x are integers and $2 \leq n$ and $x \geq 0$;
   (b) accelerating the ions by an electric field into a semiconductor;
   (c) generating dopant ions; and
   (d) implanting said dopant ions into said semiconductor.

4. The method recited in claim 3, wherein steps (a) and (b) comprise:
   (a) generating ions of the form $C_2H_x^+$ ions;
   (b) accelerating the $C_2H_x^+$ ions by an electric field into a semiconductor.

5. The method recited in claim 3, wherein steps (a) and (b) comprise:
   (a) generating ions of the form $C_3H_x^+$ ions;
   (b) accelerating the $C_3H_x^+$ ions by an electric field into a semiconductor.

6. The method recited in claim 3, wherein steps (a) and (b) comprise:
   (a) generating ions of the form $C_4H_x^+$ ions;
   (b) accelerating the $C_4H_x^+$ ions by an electric field into a semiconductor.

7. The method recited in claim 3, wherein steps (a) and (b) comprise:
   (a) generating ions of the form $C_5H_x^+$ ions;
   (b) accelerating the $C_5H_x^+$ ions by an electric field into a semiconductor.

8. The method recited in claim 3, wherein steps (a) and (b) comprise:
   (a) generating ions of the form $C_6H_x^+$ ions;
   (b) accelerating the $C_6H_x^+$ ions by an electric field into a semiconductor.

9. The method recited in claim 3, wherein steps (a) and (b) comprise:
   (a) generating ions of the form $C_7H_x^+$ ions;
   (b) accelerating the $C_7H_x^+$ ions by an electric field into a semiconductor.

10. The method recited in claim 3, wherein steps (a) and (b) comprise:
    (a) generating ions of the form $C_8H_x^+$ ions;
    (b) accelerating the $C_8H_x^+$ ions by an electric field into a semiconductor.

11. The method recited in claim 3, wherein steps (a) and (b) comprise:
    (a) generating ions of the form $C_{14}H_x^+$ ions;
    (b) accelerating the $C_{14}H_x^+$ ions by an electric field into a semiconductor.

12. The method recited in claim 3, wherein steps (a) and (b) comprise:
    (a) generating ions of the form $C_{16}H_x^+$ ions;
    (b) accelerating the $C_{16}H_x^+$ ions by an electric field into a semiconductor.

13. The method of implanting ions comprising the steps of:
    (a) producing a volume of gas phase molecules of material of the form $C_nH_x$ wherein n and x are integers, and $2 \leq n$, and x=0,1
    (b) ionizing the $C_nH_x$ molecules to form $C_nH_y^+$ or $C_nH_y^-$ ions, wherein y is an integer such that y=0 or 1; and
    (c) implanting the ionized molecules by an electric field into a target.

* * * * *

UNITED STATES PATENT AND TRADEMARK OFFICE
CERTIFICATE OF CORRECTION

PATENT NO. : 8,530,343 B2
APPLICATION NO. : 13/169341
DATED : September 10, 2013
INVENTOR(S) : Wade A. Krull It is certified that error appears in the above-identified patent and that said Letters Patent is hereby corrected as shown below:

On the Title Page, Column 2
Other Publications, Line 2, Delete "65mn" and insert -- 65nm --, therefor.

Title Page 2, Column 1
Other Publications, Line 5, Delete "8.1-B5.8.6." and insert -- 8.1-5.8.6. --, therefor.

In the Specification

Column 4
Line 11, Delete "Gonad" and insert -- Collart --, therefor.
Line 15, Delete "H.-J." and insert -- H. J. --, therefor.

Column 6
Line 46, Delete "duster" and insert -- cluster --, therefor.

Column 8
Line 2, Delete "16$^{th}$," and insert -- 16$^{th}$ --, therefor.

Column 9
Line 18, Delete "reference" and insert -- reference. --, therefor.
Line 50, Delete "arrival," and insert -- arrival --, therefor.

Column 10
Line 67, Delete "dose" and insert -- dose. --, therefor.

Column 11
Line 16, Delete "properties" and insert -- properties. --, therefor.
Line 63, Delete "implantation;" and insert -- implantation, --, therefor.

Signed and Sealed this
Twelfth Day of August, 2014

Michelle K. Lee
*Deputy Director of the United States Patent and Trademark Office*

Column 12
Line 39-40, Delete "Gdyne/cm$^2$." and insert -- Dyne/cm$^2$. --, therefor.

Column 13
Line 15, Delete "C$_{16}$H$_{x+}$" and insert -- C$_{16}$H$_x^+$ --, therefor.
Line 52, Delete "and," and insert -- and --, therefor.

Column 14
Line 13, Delete "cluster-implant" and insert -- cluster implant --, therefor.
Line 49, Delete "C$_5$H$_x$," and insert -- C$_5$H$_x^+$, --, therefor.
Line 65, Delete "Junctions" and insert -- Junctions. --, therefor.

Column 15
Line 10-11, Delete "negative," and insert -- negative --, therefor.
Line 14, Delete "types," and insert -- types --, therefor.
Line 23, Delete "13" and insert -- 13. --, therefor.

Column 17
Line 18, Delete "um" and insert -- μm --, therefor.

Column 18
Line 56, Delete "um" and insert -- μm --, therefor.

Column 19
Line 38, Delete "above" and insert -- above. --, therefor.

In the Claims

Column 20
Line 56, In Claim 13, delete "x=0,1" and insert -- x=0,1; --, therefor.